United States Patent [19]

Asai et al.

[11] 4,173,725

[45] Nov. 6, 1979

[54] PIEZOELECTRICALLY DRIVEN ULTRASONIC TRANSDUCER

[75] Inventors: Kiyokazu Asai; Akihiro Takeuchi, both of Nagoya, Japan

[73] Assignee: Kabushiki Kaisha Toyota Chuo Kenkyusho, Aichi, Japan

[21] Appl. No.: 884,148

[22] Filed: Mar. 7, 1978

[30] Foreign Application Priority Data

Mar. 7, 1977 [JP] Japan .................................. 52/24969

[51] Int. Cl.[2] .............................................. H01L 41/10

[52] U.S. Cl. .................................................... 310/325

[58] Field of Search ............... 310/322, 323, 325, 334; 239/102

[56] References Cited

U.S. PATENT DOCUMENTS

| | | | |
|---|---|---|---|
| 2,512,743 | 6/1950 | Hansell | 310/325 X |
| 3,328,610 | 6/1967 | Jacke et al. | 310/325 |
| 3,578,996 | 5/1971 | Balamuth | 310/325 |
| 3,772,538 | 11/1973 | Supitilov | 310/325 |
| 3,845,332 | 10/1974 | Last | 310/325 |

FOREIGN PATENT DOCUMENTS 2415481 10/1974 Fed. Rep. of Germany ........... 310/322

*Primary Examiner*—Mark O. Budd

*Attorney, Agent, or Firm*—Oblon, Fisher, Spivak, McClelland & Maier

[57] ABSTRACT

An ultrasonic transducer comprising a first cylindrical member which includes a mechanical vibration amplifying part formed in symmetry around the axis thereof and having a gradually increased cross-sectional area toward a base portion thereof, the base portion having a flat surface perpendicular to the axis thereof, and an annular rigid part formed with the mechanical vibration amplifying part coaxially therewith, the annular rigid part being extended from the outer wall of the base portion axially and radially outwardly to have sufficient rigidity and weight, and the annular rigid part being provided, in the proximity of the outer wall of the base portion, with an annular groove or gap having a predetermined axial depth in order to reduce the diameter of the flat surface. The transducer further comprises a second cylindrical member which includes a backing block of a cylindrical body, a base portion of which is formed with a flange and a flat surface perpendicular to the axis thereof having the larger diameter than that of the flat surface of the first cylindrical member. An ultrasonic transducer portion is interposed between the flat surfaces of the first and second cylindrical members and comprises a pair of piezoelectric elements having flat surfaces perpendicular to the axis of the first and second surfaces, and an electrode plate interposed between the pair of piezoelectric elements. A fastening device pressingly abuts the flat surfaces of the piezoelectric elements against the flat surfaces of first and second cylindrical members and integrally clamps the annular rigid part and the flange of the second cylindrical member to each other in a manner to circumvent said annular groove or gap. The ultrasonic transducer prevents the flexural vibration of the flat surface of the first cylindrical member and prevents cracking of piezoelectric elements to ensure stabilized operations without transitional variations in electric impedance and resonance frequency and to allow continuous vibrating operations in large amplitude over a long period of time.

43 Claims, 20 Drawing Figures

FIG. 8a (ii)

PIEZOELECTRICALLY DRIVEN ULTRASONIC TRANSDUCER

BACKGROUND OF THE INVENTION

This invention relates to ultrasonic transducers.

The conventional ultrasonic transducers generally have the piezoelectric elements sandwiched between two flanged metal blocks which are clamped to each other by fastening means such as bolts threaded into the flange portions of the respective blocks. With this arrangement, difficulties are encountered in that large amplitude flexural vibration is imparted to the flange portions during long ultrasonic operations, resulting in cracking or breakage of the sandwiched piezoelectric elements.

The conventional vibration amplitude magnifying type ultrasonic transducers usually employ an arrangement in which an ultrasonic transducer which has a half wavelength fundamental longitudinal resonance vibration system for converting electric oscillations into mechanical vibrations is coupled in series to an ultrasonic horn which has another half wavelength fundamental longitudinal resonance vibration system for magnifying the amplitude of the mechanical vibration, by suitable securing means such as soldering, bolting and the like. Such a vibration amplitude magnifying type ultrasonic transducer has a drawback in that it is large-sized and heavy because it consists of two fundamental longitudinal resonance vibration system coupled in series, viz., an ultrasonic transducer portion of half wavelength and an ultrasonic horn similarly of half wavelength, and thus necessarily has to have a length corresponding to one wavelength. With the vibration amplitude magnifying type ultrasonic transducer which has two fundamental resonance systems coupled in series, the intrinsic resonance frequencies of the two systems have to coincide perfectly with each other in order to generate ultrasonic vibrations effectively. In utilizing the ultrasonic vibrational energy in industrial applications, it is often the case that a machining tool or an attachment such as vibratory plate is fixed at the front end of the ultrasonic horn. In such a case, the intrinsic resonance frequency of the ultrasonic horn is influenced by the weight, shape and dimension of the attachment which is mounted at the front end of the horn as well as by the load which is externally imposed for doing some job. Therefore, the ultrasonic horns of the conventional vibration amplitude magnifying type transducers have to be designed and fabricated to have a resonance frequency which coincides with the resonance frequency of the ultrasonic transducer portion under actual working conditions. As a result, the designing and fabrication of the ultrasonic horns heretofore involved complicated calculations and experiments in determining the dimensions of the horns. Namely, enormous labor and experience have been required in designing and fabricating the vibration amplitude magnifying type transducers of conventional construction.

In an attempt to eliminate those drawbacks, the present inventors disclosed a vibration amplitude magnifying type ultrasonic transducer in their copending application (Japanese Patent Application No. 49-113147). As shown in FIG. 1(*a*), such ultrasonic transducer consists of a mechanical vibration magnifying block A with a flange A1 of large diameter located at a position distant from the mechanical vibration output end A2 by a length corresponding to one-quarter of the transmitting ultrasonic wavelength, for receiving a plural number of bolts E, a backing block B consisting of a cylindrical block of a predetermined length and having at its base end a circular flange B1 of predetermined wall thickness, a pair of piezoelectric elements C1 and C2 interposed between the aforementioned flanges, and bolts E and nuts F fastening the opposing flanges to each other through an annular support plate D which is in engagement with the flange A1 of the mechanical vibration magnifying block A. This transducer has the flange portions and the piezoelectric elements located in the vicinity of a point (at the node of longitudinal vibration mode) distant by a length corresponding to one-quarter of ultrasonic wavelength from the mechanical vibration output end A2 which is located at the antinode of the longitudinal vibration mode of the mechanical vibration magnifying block A, and has the other end B2 of the backing block provided at a point (at the antinode of longitudinal vibration mode), distant by a length corresponding to a half ultrasonic wavelength, thus acting as an ultrasonic transducer with a half wavelength fundamental longitudinal resonance vibration system as a whole and at the same time functioning as an ultrasonic horn of a half wavelength fundamental resonance vibration system for the magnification of the amplitude. Therefore, the transducer is extremely compact in construction and light-weight and can find various applications in those fields where there are severe spatial restrictions.

However, the transducer of the above construction still can cause cracking to the piezoelectric element such as PZT which is abutted against the flange portion of the mechanical vibration magnifying block, due to the flexural vibration of the block which might be imparted thereto when the transducer is vibrated at large amplitude continuously over an extremely long time period, with resultant transitional variations in electric impedance and resonance frequency of the transducer. Similarly to the conventional devices, the above-described transducer also has a problem in that, when the transducer is fixedly supported on an external structure through an annular support plate D which is provided at the node of the longitudinal vibration, the fixed support of the vibratory element entails energy losses and deteriorations in the operating characteristics of the transducer.

The results of our study on the causes of the above problems are now explained with reference to FIG. 1(*b*). The transducer T has the node of its longitudinal vibration in the vicinity of the center point G of annular flat surface A11 of the mechanical vibration magnifying block A, the respective parts along the axis of the transducer resonating in the mode with longitudinal vibrational displacements as shown in the graph of FIG. 1.

This vibration causes longitudinal vibration L having vibrational displacements parallel to the axis of the transducer, but, concurrently with axial vibrational distortions, there also occur radial vibrational distortions in an amount according to Poisson's ratio. As a result, the transducer also has radial vibration R, expanding and contracting in the radial directions though in a slight degree. The radial vibrational displacement is largest at the node of vibration where the stress of the longitudinal vibration is maximum or the displacement of the longitudinal vibration is zero as shown by the dotted lines in the graph of FIG. 1. This radial vibrational displacement induces and causes flexural vibration K to the flange portion A1 of the mechanical vibration magnifying portion A, imparting curved vibrational displacements to the flat end surface A3 of the flange portion and imposing bending load repeatedly on the piezoelectric element. The piezoelectric elements are therefore susceptible to cracking damages especially in a long drive in large amplitude.

The above transducer has the flange A1 of the mechanical vibration magnifying portion formed in a large diameter to receive a number of bolts E which are employed as clamping means and constructed to permit of suitable elastic deformation upon bending deformation of the flange, resulting in inducement of undesirable flexural vibrations to the flange portion as described hereinbefore.

In addition, the conventional transducer has the annular support plate D arranged simply to provide uniform and resilient support for the flange A1, failing to restrict or suppress the flexural vibrations of the flange and to let the entire area of the annular flat surface A11 of the mechanical vibration magnifying block A act perfectly as a node of the longitudinal vibration. Therefore, the annular support plate D is allowed to vibrate, though in a slight degree, concurrently with the vibration of the transducer, influencing the resonance characteristics of the transducer. This causes losses of vibrating energy and deterioration of operating characteristics in the case where the transducer is fixedly supported on an external structure through the annular support plate D.

SUMMARY OF THE INVENTION

The instant invention is a result of systematic experiments and the theoretical analysis which have been conducted by the present inventors with an aim to develop a vibration amplitude magnifying type ultrasonic transducer which overcomes the above-mentioned drawbacks of the conventional transducers. The durability of the transducer of the invention has been confirmed by endurance tests.

It is an object of the present invention to provide an ultrasonic transducer which can prevent cracking of piezoelectric elements such as PZT to ensure stabilized operations without transitional variations in electric impedance and resonance frequency and to allow continuous vibrating operations in large amplitude over a long period of time.

It is another object of the present invention to provide an ultrasonic transducer in which the flange portion of the cylindrical body for the mechanical vibration magnifying portion is formed in a small width and in a small outer diameter slightly projecting radially outwardly from the cylindrical body and axially fastened by an annular rigid body which is clamped by fastening means to the flange of another cylindrical body leaving an annular gap around the flange portion of the first cylindrical body, thereby preventing flexural vibration of the flange portion of the first cylindrical body of the mechanical vibration magnifying portion and its flat surface which is abutted against a piezoelectric element.

It is still another object of the present invention to provide a vibration amplitude magnifying type ultrasonic transducer which can prevent cracking of piezoelectric elements such as PZT.

It is a more specific object of the present invention to provide improvements in vibration amplitude magnifying type ultrasonic transducer consisting of a half wavelength fundamental longitudinal resonance vibration system and capable of converting electric oscillations into mechanical vibrations and magnifying the amplitude of the converted mechanical vibrations, wherein piezoelectric elements are interposed between a flat surface of a flange at the base end of a mechanical vibration magnifying portion of a length corresponding to one-quarter wavelength and a flat surface of a flange on a backing block, which flanges are fastened to each other by a number of bolts through an annular member which is in engagement with the flange of the mechanical vibration magnifying block, and wherein the circular flange at the base end of the mechanical vibration magnifying portion is formed small enough to have its circumference enclosed within the circular area defined by the fastening bolts to prevent inducement of flexural vibration of the flange due to radial vibration of the transducer, the annular flat surface of the above-mentioned flange on the side of the mechanical vibration output end being securely engaged with a thick annular rigid body with sufficient rigidity and weight to support the flange in a rigid and restricted manner and increase the bending rigidity of the flange thereby forcibly suppressing generation of flexural vibration of the flange due to the radial vibration of the transducer to prevent cracking of piezoelectric elements such as PZT and ensuring stabilized operations without transitional variations in electric impedance and resonance frequency even in continuous vibrating operations in large amplitude and over an extremely long period of time.

It is a further object of the present invention to provide a vibration amplitude magnifying type ultrasonic transducer of high practical utility, wherein the annular flat surface of the flange which circumvents the sectional area of the mechanical vibration magnifying portion (sectional base plane) located at the node of the longitudinal vibration of the transducer is supported in a rigidly restricted manner to prevent the annular flat surface from longitudinal vibrational displacements to set the whole structure of the transducer in ideal longitudinal resonance vibration using as a nodal plane the entire area of the annular flat surface and the cross-section (sectional base plane) which is circumvented by the annular flat surface, and wherein an annular gap is provided around the flange portion in a manner to circumvent the nodal plane of the longitudinal vibration to prevent the radial vibrations which occur concurrently with the longitudinal vibration from being transmitted to the annular rigid body, insulating the annular rigid body in a state of zero vibrational displacement to allow the transducer to be fixedly mounted on or assembled with other structures through the annular rigid body without imparing the resonance vibration characteristics.

It is a still further object of the present invention to provide a vibration amplitude magnifying type transducer which has the flange portion of the mechanical vibration magnifying portion engaged with the annular rigid body through a small annular area on the flange surface to provide a large fall in acoustic impedance across the mechanical coupling between the flange portion and the annular rigid body and prevent transmission of ultrasonic wave energy from the flange portion to the annular rigid body, thereby holding to a minimum the energy loss which might occur when the transducer is fixedly supported.

It is a further object of the present invention to provide a vibration amplitude magnifying type ultrasonic transducer in which a variety of attachments such as ultrasonic machining tools, vibratory plates and the like can be replaceably fixed at the front end of the mechanical vibration magnifying portion of the ultrasonic horn without requiring changes in the shape and dimension of the major structures of the transducer including the mechanical vibration magnifying portion and the piezoelectric elements such as PZT of the ultrasonic transducer portion, and perfect resonance of the transducer can be effectuated simply by changing the length of the backing block.

It is a still further object of the present invention to provide a vibration amplitude magnifying type ultrasonic transducer which attains the foregoing objects and in which the lengths of the mechanical vibration output portion and the backing block can be changed in a simplified manner without causing changes in the major structures of the transducer to make it possible to alter the frequency of the generating ultrasonic waves arbitrarily and easily.

It is still another object of the present invention to provide a vibration amplitude magnifying type ultrasonic transducer in which the backing block is provided with a petal type flange with a plural number of support arms to preclude generation of undesirable false vibrations or the unnecessary vibrations of the so-called spurious mode which is produced concurrently with the intended major vibrations, thereby ensuring stabilized drive of the transducer and increasing all the more the efficiency of conversion of electric oscillations into ultrasonic mechanical vibrations.

The objects of the present invention are achieved by an ultrasonic transducer comprising a first cylindrical member having at one axial end a mechanical vibration magnifying portion and at the other end a flange with a narrow annular flat surface slightly projecting radially outwardly along a nodal plane of a longitudinal resonance vibration mode, the first cylindrical member having at the other end a vertical flat surface of a predetermined area; an annular member having sufficient rigidity and dimension is compared with the flange of the first cylindrical member and having at the axial end of the inner peripheral wall portion thereof a stepped portion consisting of an annular inner surface formed parallel with the axis thereof and an annular flat bottom surface perpendicular to the axis, the bottom surface of the stepped portion being uniformly engaged with the annular flat surface on the flange of the first cylindrical member and the inner annular surface retaining a narrow annular gap around the outer periphery of the flange when the first cylindrical member is coaxially inserted in the annular member; a second cylindrical member having a cylindrical body of predetermined outer diameter and length and provided at the base end thereof a flange having a flat surface of predetermined area perpendicularly to the axis thereof and predetermined outer diameter and wall thickness; an ultrasonic transducer portion interposed between flat surface at opposingly disposed axial end faces of the first and second cylindrical members and having a pair of piezoelectric elements on opposite sides of an electrode plate, the piezoelectric elements being connected to an ultrasonic oscillator and having flat surfaces perpendicular to the axis of the opposingly disposed axial ends and of an area smaller than the flat surfaces of the first and second cylindrical members; and fastening means pressingly abutting the flat surfaces of the ultasonic transducer portion against the flat surfaces of the first and second cylindrical members and integrally clamping the annular rigid body and the flange of the second cylindrical member to each other in a manner to circumvent the annular gap and the ultrasonic transducer portion.

In the above ultrasonic transducer construction according to the invention, the flange of the first cylindrical member is formed in a reduced diameter to increase the intrinsic frequency of the flange for precluding its flexural vibrations, preventing cracking of the piezoelectric elements of the ultrasonic transducer through the suppression of the flexural vibration of the flange and flat surface of the first cylindrical member to allow ultrasonic vibrating operations in large amplitude over a long period of time.

In one aspect of the invention (the first aspect) which is applied to a vibration amplitude magnifying type ultrasonic transducer, the invention comprises a mechanical vibration magnifying portion serving as the first cylindrical member and consisting of a block having a mechanical vibration input end of a large sectional area, a flange of small diameter and having a predetermined wall thickness, the flange of small diameter being located at a position spaced from the mechanical vibration output end by a distance corresponding to one-quarter wavelength of longitudinal resonance vibration mode, and a flat surface of predetermined area provided in the proximity of the flange to serve as the mechanical vibration input end; an annular rigid member formed in a relatively large wall thickness to have sufficient rigidity and weight, the annular rigid member being uniformly and securely engaged with the entire area of the small annular flat which is provided on the small-diameter flange on the side of the mechanical vibration output end in a position coinciding with the nodal plane of a longitudinal resonance vibration mode of the mechanical vibration magnifying member and forming an annular gap around the circumference of the small-diameter flange; a backing block serving as the second cylindrical member consisting of a block of predetermined length shorter than one-quarter wavelength and having at the base end thereof a flange of predetermined wall thickness and having a flat surface of predetermined area; an ultrasonic transducer portion having a pair of piezoelectric elements interposed between the flat surfaces of the mechanical vibration magnifying member and the backing block and connected to an ultrasonic oscillator, the opposite end faces of the piezoelectric elements having an area smaller than the flat surfaces of the blocks; and a fastening means abutting the flat surfaces of the transducer portion against opposing flat surfaces of the mechanical vibration magnifying portion and the backing block and clamping the flanges to each other through the annular rigid member in a manner to circumvent the annular gap and the ultrasonic transducer portion; thereby rigidly and restrictedly supporting the annular flat surface portion of the flange of the mechanical vibration magnifying member disposed on the side of the mechanical vibration output end to circumvent the nodal plane of half wavelength fundamental longitudinal resonance vibration system, and clamping the ultrasonic transducer portion integrally to the opposing flanges to effectuate as a whole a half wavelength longitudinal resonance vibration mode.

In the above ultrasonic transducer construction according to the first aspect of the invention, the diameter of the flange at the base end of the mechanical vibration magnifying portion is minimized considerably as compared with the conventional counterparts, and the annular flat surface of the flange on the side of the mechanical vibration output end is securely engaged with a thick annular rigid vibration output end is securely with a thick annular rigid body with sufficient rigidity and weight to increase the bending rigidity of the flange as a whole and its relative weight, thereby preventing generation of flexural vibration of the flat surface of the flange which is in intimate contact with the piezoelectric element to preclude cracking or damages of the piezoelectric element and allow continuous drive in large amplitude over an extremely long period of time without causing transitional variations in electric impedance and resonance frequency.

In the transducer according to the first aspect, in order to preclude displacements of longitudinal vibration in the entire sectional base plane, along the nodal plane of the half wavelength fundamental longitudinal resonance vibration, the flange of the mechanical vibration magnifying portion which circumvents the base plane is rigidly and restrictedly supported at its annular flat surface on the side of the mechanical vibration output end. Thus, the transducer is in its entirety set in resonance in an ideal longitudinal vibration mode using as a nodal plane the aforementioned annular flat surface at the node of longitudinal vibration (vibrational displacement zero) and the entire area of the sectional plane (sectional base plane) which is encircled by the annular flat surface. The provision of the annular gap around the flange portion circumventing the nodal plane of the longitudinal vibration prevents the radial vibration which is generated concurrently with the longitudinal vibration from being directly transmitted to the annular rigid body. Therefore, the transducer can effectuate extremely stabilized resonance vibrations, whereas, the annular rigid body remains a rigid body with zero vibrational displacement so that the transducer can be assembled with other structures through the annular rigid body without entailing drops in the resonance and other operating conditions of the transducer.

In addition, the transducer of the first aspect has the thick annular rigid body engaged with the flange surface of the mechanical vibration magnifying portion through the small annular surface of the flange to provide a large fall in acoustic impedance across the mechanical coupling between the thick annular rigid body and the flange, thereby preventing transmission of ultrasonic wave energy from the flange to the annular rigid body and holding to a minimum the dissipative energy losses which would occur when the transducer is fixedly supported on an external structure.

Further, the transducer of the first aspect has the flange of the mechanical vibration magnifying portion rigidly and restrictedly supported at the annular flat surface on the side of the mechanical vibration output end, so that, irrespective of the resonance frequency, the nodal plane of the longitudinal resonance vibration system is always located at the sectional plane (sectional base plane) which is circumvented by the annular flat surface. The two elements, i.e., the mechanical vibration magnifying portion having one-quarter wavelength resonance mode with a node of vibration at the sectional plane containing the annular flat surface and the backing portion (the ultrasonic transducer portion and the backing block) having another one-quarter wavelength resonance mode, are coupled with each other to effectuate as a whole a half wavelength fundamental longitudinal resonance vibration. The backing block can be replaced to change its length arbitrarily. Therefore, even in a case where an ultrasonic machining tool, vibratory plate or other attachment is mounted at the front end of the mechanical vibration magnifying portion, the resonance of the whole transducer can be attained easily and perfectly by changing the block of the backing portion, without moving or changing the position of the node of the longitudinal resonance vibration.

In another aspect of the invention (the second aspect), the annular flat surface of the flange of the first cylindrical member, on the side of the mechanical vibration magnifying portion, is integrally joined with the bottom surface of the stepped portion of the annular rigid body by soldering or welding means, thereby to strengthen the engagement between the first cylindrical member and the annular rigid body for ensuring stabilized ultrasonic vibrations and at the same time enhancing the ultrasonic wave conversion efficiency.

In another aspect of the invention (the third aspect), the flat surface of the first cylindrical member in abutting engagement with the ultrasonic transducer portion is axially projected, thereby increasing the bending rigidity of the flat surface of the first cylindrical member to preclude the displacement of the ultrasonic transducer portion including the piezoelectric elements, thus preventing cracking damages of the piezoelectric elements and pressing the ultrasonic transducer portion with the projected flat surface to improve its abutting engagement in such a manner as to apply uniform pressure on the entire flat surfaces of the ultrasonic transducer portion to effectuate stabilized ultrasonic vibrations.

In still another aspect of the invention (the fourth aspect) the first cylindrical member and the annular rigid body are constituted by a single integral structure which is provided with an annular groove to serve as the annular gap, thereby strengthening the engagement between the first cylindrical member and the annular rigid body all the more as compared with the second aspect to effectuate more stabilized ultrasonic vibrations and at the same time to enhance the ultrasonic wave conversion efficiency.

In still another aspect of the invention (the fifth aspect), the flange of the second cylindrical member has its wall notched except for those portions which are clamped by the fastening means, to present a form of petals, cutting at the notched portions the unnecessary flexural vibrations which would otherwise be generated along the circumference of the flange of the second cylindrical member. In addition to the prevention of flexural vibrations, it becomes possible to reduce the weight as compared with the conventional counterpart and to increase the rigidity to a desired value by increasing the wall thickness of the fastening portions. The ultrasonic transducer portion is thus pressed uniformly to ensure stable ultrasonic vibrations with increased efficiency of conversion of electric oscillations into mechanical vibrations.

In another aspect of the invention, (the sixth aspect), the mechanical vibration output portion has an amplifying horn consisting of a replaceable front end portion and a base end portion, while the backing block consists of a main block and a replaceable resonance adjusting block, making it possible to alter the frequency of the ultrasonic wave easily and arbitrarily by changing the lengths of the front end portion of the amplifying horn and the resonance adjusting block.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
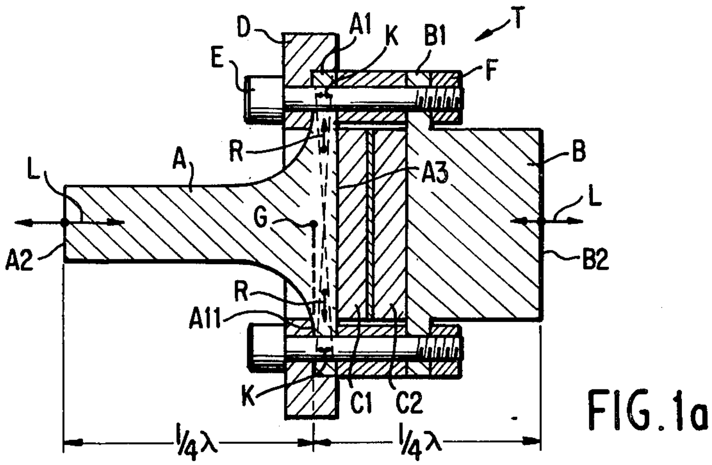
FIGS. 1*a* and 1*b* are a sectional view and a graphic illustration of vibrational displacements in various portions, respectively, of a conventional ultrasonic transducer.
Figure 1B:
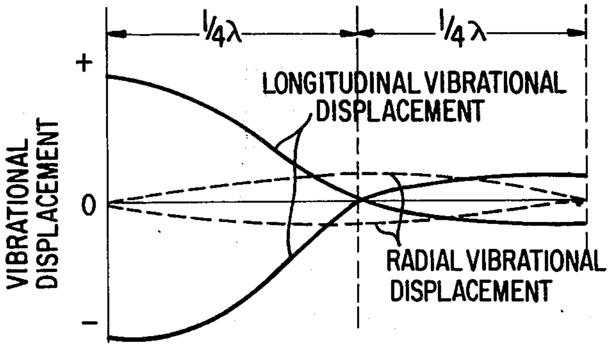
Figure 2A:
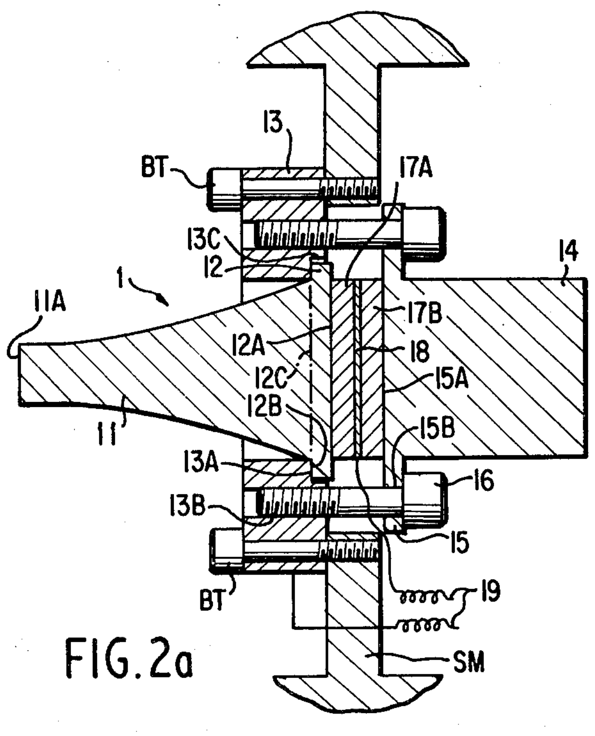
FIGS. 2*a* and 2*b* are a diagrammatic view of a first embodiment of the ultrasonic transducer according to the present invention and a view of the backing block thereof, respectively.

The description is now made of the first embodiment of the invention with reference to FIG. 2(*a*). In the first embodiment, the present invention is applied to a vibrational amplitude magnifying type ultrasonic transducer.

Figure 2B:
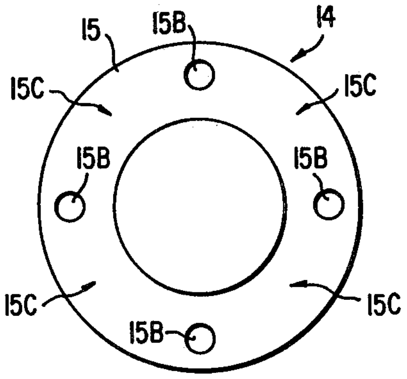

The vibrational amplitude magnifying type ultrasonic transducer of the first embodiment has, as the first cylindrical member, a mechanical vibration amplifying portion 1 which consists of an exponential type mechanical vibration output portion 11 and a disc-like flange 12 which is provided at its base and having a smaller diameter as compared with the conventional counterpart. The flange 12 is formed integrally with the mechanical vibration output portion 11 and has at its axial end face a flat surface 12A to serve as a mechanical vibration input end and an annular flat surface 12B of a small thickness for engagement with an annular rigid body 13. The annular rigid body 13 is constituted by an annular member which is sufficiently larger than the aforementioned flange 12 in inner and outer diameters and thickness and has sufficient rigidity and weight. The annular rigid body is provided with an engaging surface 13A which is stepped in L-shape for intimate contact with the entire areas of the annular flat surface 12B of the mechanical vibration magnifying portion, and with a number of tapped holes 13B in equally spaced relations in the circumferential direction for threaded engagement with a corresponding number of bolts 16. A backing block 14 which serves as the second cylindrical member consists of a cylindrical body which has a disc-like flange 15 integrally at its base for fixing purposes. The flange 15 is provided with a number of through-holes 15B as shown in FIG. 2*b* for receiving bolts 16 which are threaded into tapped holes 13B in the annular rigid body 13 of sufficiently large diameter to clamp the small-diameter flange 12 of the aforementioned mechanical vibration magnifying portion 1 and the opposing flange 15 of the backing block 14 tightly to each other, sandwiching therebetween piezoelectric elements 17A and 17B in the form of solid circular plates and an electrode plate 18 which constitute the ultrasonic transducer section. As a result, the piezoelectric elements 17A and 17B and electrode 18 are axially pressed by and retained between the flat end faces of the opposing flanges. The circular flange 12 which is provided at the base of the mechanical vibration magnifying block is formed small enough to have its outer diameter within the circular region which is circumvented by the clamping bolts, in order to prevent inducement of flexural vibrations. In addition, the annular flat surface 12B has a smooth finish so that its entire small annular area is contacted uniformly and intimately with the engaging surface 13A of the rigid annular body 13 upon firmly tightening the bolts 16. Along the boundaries between the circumference of the circular flange 12 and the annular rigid body 13, there is provided an annular space 13C which circumvents the circular flange 12 to prevent the radial vibrations which occur to the flange portion during the longitudinal vibrations of the transducer from being transmitted directly to the annular rigid body 13. On the other hand, the flange 15 of the backing block 14 formed in a larger diameter to provide the clamping support by the bolts 16 and at the same time formed in a predetermined thickness to provide a suitable elasticity to act as a leaf spring of high rigidity when a bending displacement within its elastic deformation range is imparted thereto. As shown in FIG. 2(*a*), the annular rigid body 13 is secured to a fixed support member SM by bolts BF to support the transducer fixedly.

The aforementioned piezoelectric elements 17A and 17B are connected to an ultrasonic oscillator (not shown) and have the respective positive poles disposed face-to-face on opposite sides of the electrode 18. The negative poles of the piezoelectric elements 17A and 17B are held in contact respectively with the flat surface 12A forming the mechanical vibration input end of the mechanical vibration magnifying portion and the flat surface 15A of the flange 15 of the backing block, under the static pressure which is applied through the flange 15 of the backing block acting as a leaf spring.

The mechanical vibration magnifying portion 1, piezoelectric elements 17A and 17B, electrode 18 and backing block 14 all vibrate as an integral body at the predetermined frequency, the respective parts dimensioned to provide half-wave fundamental longitudinal resonance vibration with the nodal plane of vibration at the annular plane 12B of the mechanical vibration magnifying portion and the sectional base plane 12 on the extension of the just-mentioned annular plane. More specifically, the distance between the mechanical vibration output end 11A and the sectional base plane 12C (the nodal plane of the half-wave longitudinal resonance vibration) of the mechanical vibration magnifying portion 1, corresponds to the one-quarter wavelength of the resonance mode in which the transducer resonates at the predetermined frequency. On the other hand, the length of the backing block 14 is experimentally determined such that the transducer in its entirety has half-wavelenght longitudinal resonance vibration with a node at the annular plane surface 12B and the sectional base plane 12C. The reference numeral 19 denotes lead wires which are connected to the electrode 18 and the annular rigid body 13, respectively.

The operation by the amplitude magnifying type ultrasonic oscillator transducer of the first embodiment is as follows. The external ultrasonic applies electric oscillatory currents to the piezoelectric elements 17A and 17B at the same frequency as the resonance frequency of the vibration amplitude magnifying type ultrasonic transducer thereby to generate mechanical vibrations. The mechanical vibration puts the mechanical vibration magnifying member 1, piezoelectric elements 17A and 17B and backing block 14 in longitudinal resonant vibration as an integral body with a node of vibration at the annular flat surface 12B of the mechanical vibration magnifying member 1 and the sectional base plane 12C on the extension of the just-mentioned annular flat surface, magnifying the amplitude of the vibration at the mechanical vibration output portion 11 to put the mechanical vibration output end 11A in ultrasonic vibration of large amplitude to generate ultrasonic waves.

With the transducer of the first embodiment as constructed above, the flange 12 of the mechanical vibration magnifying member 1 is formed in a small diameter and it is possible to increase the intrinsic frequency of vibration of the flange to an extremely high frequency, while preventing flexural displacement to preclude inducement of flexural vibration to the flange and reducing the abutting surface area of the flange 12 to ensure uniform abutment. Furthermore, the annular rigid body 13 is tightly engaged with the flange 12, to rigidly support the flange and to forcibly suppress the flexural vibration of the flat surface 12A and the flange thereby preventing cracking of the piezoelectric elements such as PZT and ensuring stabilized operation without transitional variations in the electric impedance and the resonance frequency even when the transducer is continuously put in vibration at great amplitude over a long period of time.

By rigidly restricting and supporting the annular flat surface 12B of the flange which is located at the node of vibration of the half wavelength longitudinal vibration system of the transducer thereby to prevent the annular flat surface from longitudinal vibrational displacements, it becomes possible to put the transducer as a whole in ideal longitudinal resonance vibration to provide extremely stabilized vibration with a node at the aforementioned annular flat surface and the sectional base plane of the mechanical vibration magnifying member which is on the extension of the annular flat surface. Further, the annular space 13C prevents the transmission, to the annular rigid body, of the radial vibrations which are generated concurrently with the longitudinal vibrations. Therefore, the annular rigid body of the transducer acts as a node of vibration (vibrational displacement zero) and grips the narrow annular flat surface 12B of the flange portion 12, without restricting the vibration of the transducer, so that the operational characteristics of the transducer are not adversely affected even when it is rigidly supported on an external support member SM through the annular rigid body 13.

Furthermore, the annular rigid body is held in engagement with the mechanical vibration magnifying member through the small annular surface to provide a large fall in acoustic impedance across the mechanical coupling between the flange portion and the annular rigid body. This prevents the ultrasonic energy from being transmitted from the flange portion to the annular rigid body, so that, when the transducer is fixed on an external support in actual use, the fixed support causes only an extremely small energy loss.

The transducer of the present embodiment has another advantage in that it has very compact construction consisting of a single basic half-wavelength vibration system which has dual roles as an ultrasonic transducer for converting electric oscillations into mechanical vibrations and as an ultrasonic horn for magnifying the amplitude of the mechanical vibrations.

This transducer has another advantage in that the position of node of the resonance vibration system is fixed constantly at a predetermined location and the backing block is replaceable by removing the clamping means, so that a drive which satisfies the resonance conditions of the transducer can be easily attained by altering the length of the backing block according to the load in actual operations. The handling in actual use is thus simplified extremely.

Figure 3:
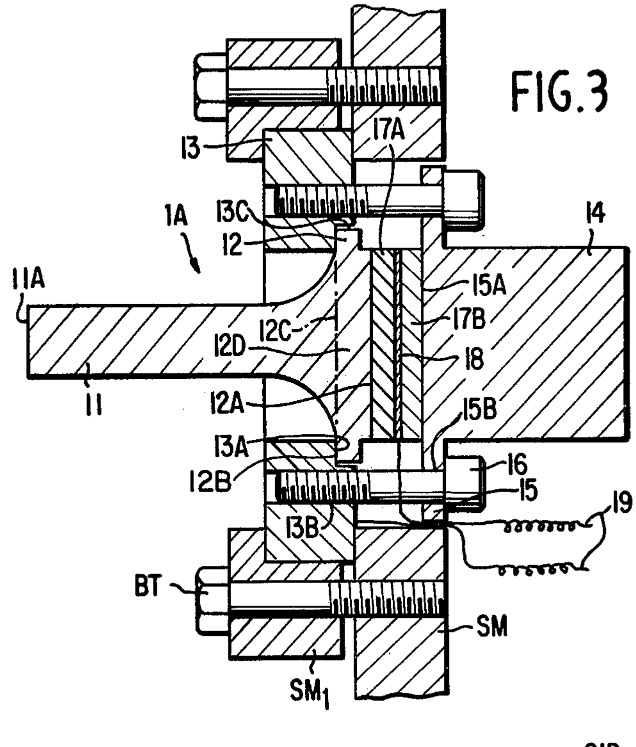
FIG. 3 is a sectional view of a second embodiment of the ultrasonic transducer according to the invention.

The present invention may be reduced to practice in the form of the second embodiment shown in FIG. 3. The vibration amplitude magnifying type ultrasonic transducer of the second embodiment is distinguished in that the base portion of the mechanical vibration magnifying member has a modified shape (the third aspect) as compared with the first embodiment. In the following description, those parts which are common to the first embodiment are designated by common reference numerals and their explanations are omitted.

In this embodiment, the base end portion of the mechanical vibration output portion 11 of the mechanical vibration amplifying member 1A in the form of a stepped type horn is formed with a small diameter disc-like flange 12 which has, integrally formed therewith, a circular projection 12D projecting axially from the flange 12 and having a circular flat surface 12A, the circular flat surface 12A of the circular projection 12D compressingly holding, in cooperation with the flat surface 15A of the flange 15 of the backing block 15, piezoelectric elements 17A and 17B and electrode 18 which constitute the ultrasonic transducer portion. The circular projection 12D of this embodiment has the same outer diameter as the piezoelectric element 17A and projects stepwise from the flange portion, the wall thickness of the flange being increased stepwise at those portions which are in contact with the piezoelectric element 17A to impart thereto high bending rigidity and at the same time to reduce the influence of vibration of the flange which would otherwise be imposed on the circular projection, thereby suppressing all the more the influence of curved vibrational displacement of the circular flat surface 12A which would otherwise be imposed on the piezoelectric element. The transducer of the present embodiment therefore can prevent cracking of the piezoelectric elements like PZT in a more assured manner than the first embodiment and allows stabilized continuous vibrational operations of large amplitude over a long period of time without causing transitional variations in the electric impedance as well as in the resonance frequency. Similarly, the transducer of the present embodiment can prevent the cracking of the piezoelectric elements and ensure long stabilized operations even in the case of a large power transducer with an ultrasonic transforming means consisting of piezoelectric elements of larger diameter. In addition to the just-mentioned effects, the second embodiment has the same excellent effects as the first embodiment.

In contrast to the first embodiment, the transducer of the second embodiment is provided with a circular projection 12D at the base end of the mechanical vibration magnifying member and adapted to compressingly hold the piezoelectric elements through the circular projection 12D, giving a better grip on the piezoelectric element to hold it in a uniformly gripped state and to allow stabilized ultrasonic vibration.

The transducer of the second embodiment employs a stepped type horn for the mechanical vibration magnifying member, so that the base end portion (flange portion) has a lower bending rigidity as compared with other conical or exponential type horns. However, the circular projection 12D contributes to enhance the bending rigidity and to prevent flexural vibrations.

Furthermore, the transducer of the second embodiment is fixed in position through the annular rigid body 13 which is gripped by bolts BT between the support member SM with tapped holes and an annular support member $SM_1$ having L-shaped stepped portion which engages with the outer periphery of the annular rigid body 13. The transducer itself is gripped in position by the bottom surface of the narrow L-shaped stepped portion of the annular rigid body 13, so that the vibration of the transducer is free of any restrictions.

Figure 4:
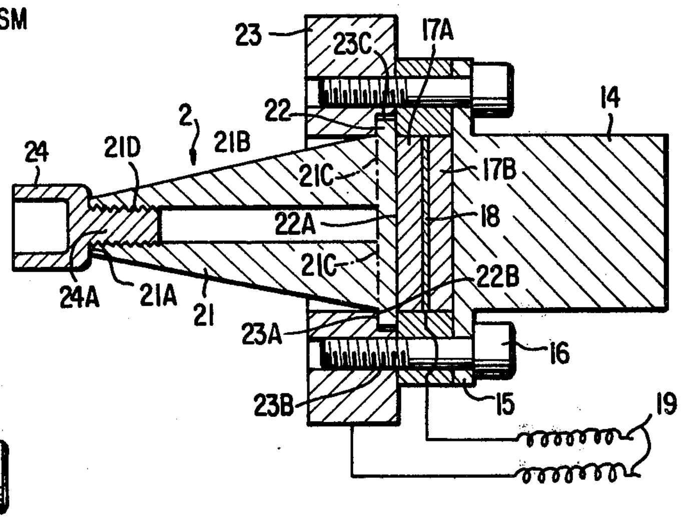
FIG. 4 is a sectional view of a third embodiment of the ultrasonic transducer according to the invention.

The invention is now described by way of the third embodiment shown in FIG. 4.

The feature of the vibration amplitude magnifying type ultrasonic transducer of the third embodiment resides in that the engagement between the flange 22 of the mechanical vibration magnifying member 2 and the annular rigid body 23 is effected by metallic joining means such as soldering, welding and the like (the second aspect of the invention). Another feature unique to this embodiment is that the mechanical vibration output member is provided with means for coupling various ultrasonic machining tools. In the following description, those parts which are common to the first embodiment are designated by common reference numerals.

In the transducer of the third embodiment, the mechanical vibration magnifying member 2 consists of a hollow mechanical vibration output portion 21 in the form of a conical horn and a disc-like flange 22 which is provided at the base end of the output portion 21. The flange 22 is formed integrally with the mechanical vibration output portion 21 and provided with a circular flat surface 22A to serve as a mechanical vibration input end and with an annular joint surface 22B of a small width for contacting engagement with the annular rigid body 23. The annular rigid body 23 has a sufficiently large sectional area as compared with the flange portion to constitute a thick annular structure with sufficient rigidity and weight. The annular rigid body 23 is provided with an annular joint surface 23A for engagement with the annular joint surface 22B of the flange 22 of the aforementioned mechanical vibration magnifying member. The annular rigid body 23 and the flange 22 of the mechanical vibration magnifying member are soldered together at the abovementioned annular joint surfaces 23A and 22B uniformly and securely over the entire surfaces thereof to support the flange 22 of the mechanical vibration magnifying member 2 rigidly at the annular joint surface 22B. Similarly to the foregoing embodiment, an annular gap space 23C is provided along the boundaries between the outer periphery of the flange 22 and the annular rigid body 23. The mechanical vibration magnifying member 2 is provided with a center bore 21B which extends along its longitudinal axis from the mechanical vibration output end 21A to a sectional base plane 21C of the mechanical vibration magnifying member. The center bore 21B has an internally threaded portion 21D at the fore end thereof to allow attachment of a variety of ultrasonic machining tools. The annular rigid body 23 is further provided with a number of tapped holes 23B in equally spaced relations in the circumferential direction for threaded engagement with a corresponding number of bolts 16 which secure the piezoelectric elements of the ultrasonic transducer and the backing block 14 in the respective positions. The backing block 14 has the same construction as in the first embodiment described hereinbefore.

The small-diameter flange 22 of the mechanical vibration magnifying member 2 and the opposingly disposed large-diameter flange 15 of the backing block 14 are fastened to each other by the annular rigid body 23 which holds the mechanical vibration magnifying member 2 and the bolts 16 which are threaded into the tapped holes 23B of the annular rigid body 23, tightly and integrally clamping therebetween piezoelectric elements 17A and 17B of solid disc form and an electrode 18 which constitute the ultrasonic transducer section. The piezoelectric elements 17A and 17B and the electrode 18 are uniformly compressed to each other in the axial direction between the flat surfaces of the opposing flanges. An ultrasonic machining tool 24 is securely fixed at the distal end of the mechanical vibration output portion 21 through a mounting portion 24A which is in threaded engagement with the internally threaded portion 21D.

In this instance, the flange 22 which is provided at the base end of the mechanical vibration magnifying member 21 is formed in a small size as in the first embodiment to increase the intrinsic frequency of the flange and at the same time to prevent large bending displacements which would induce flexural vibrations. The annular joint surface 22B of the flange which circumvents the sectional base plane 21C of the mechanical vibration magnifying member is supported by the annular rigid body 23 in a restricted and rigid manner.

The mechanical vibration magnifying member 2, piezoelectric elements 17A and 17B, electrode 18 and backing block 14 vibrate integrally at the predetermined frequency together with the ultrasonic machining tool 24, the respective parts being dimensioned to provide basic half-wavelength longitudinal resonance vibration with a nodal plane at the annular joint surface 22B of the mechanical vibration magnifying member and the sectional base plane 21C which is located on the extension of the just-mentioned annular joint surface.

More particularly, the length of the mechanical vibration magnifying member 2 between its mechanical vibration output end 21A and its sectional base plane 21C (the nodal plane of the half-wavelength longitudinal resonance vibration) corresponds to one-quarter wavelength of the vibrational mode in which the transducer resonates at the predetermined frequency. On the other hand, the length of the backing block 14 has been determined by calculations and experimentally such that the transducer will provide half-wavelength longitudinal resonance vibration with a nodal plane at the aforementioned annular joint surface 22B and the sectional base plane 21C. The construction in other respects are same as in the first embodiment and therefore its explanation is omitted.

In a manner similar to the first embodiment, the vibration amplitude magnifying type ultrasonic transducer of the third embodiment converts electric oscillation which applied from an external ultrasonic oscillator into mechanical vibrations, magnifies the amplitude of the vibration and put the mechanical vibration output end 21A and its adjoining portions of the transducer in ultrasonic vibrations of large amplitude, imparting the ultrasonic vibrations of large amplitude at the same time to the ultrasonic machining tool 24. With this transducer construction, the cracking of the piezoelectric elements such as PZT is prevented and the transducer can provide extremely stabilized continuous vibrational operation of large amplitude for a long period of time without transitional variations in the electric impedance and the resonance frequency. Even in a case where the transducer is rigidly supported on an external support member through the annular rigid body, there can be obtained the excellent effects similar to the first embodiment, i.e., the effects of preventing deterioration of conversion characteristics of the transducer and the energy loss which would result from the fixed support of the transducer.

Moreover, in the transducer of the present embodiment, the engagement between the flange 22 of the mechanical vibration magnifying member and the annular rigid body 23 is effected through a metallic joining means such as soldering to ensure rigid and restrictive support for the flange 22. As a result, it becomes possible to employ a flange 22 of smaller wall thickness as compared with the first embodiment and enhance the ultrasonic wave conversion efficiency by the transducer.

In addition, the transducer of the third embodiment is adapted to allow attachment of various ultrasonic machining tools replaceable at the front end of the mechanical vibration magnifying member 2. The transducer is designed to resonate in a single half-wavelength fundamental longitudinal vibration mode having a nodal plane of the longitudinal vibration determined precisely at the annular joint surface 22B of the mechanical vibration magnifying member and the sectional base plane 21C which is circumvented by the annular joint surface 22B, irrespective of the frequency of resonance. The backing block is replaceable so that, when an ultrasonic machining tool of a different shape and size is attached, a variation in the resonance frequency of the mechanical vibration magnifying member can be corrected simply and completely by replacing the backing block 14 by the one of suitable length which satisfies the resonance conditions of the transducer. In this connection, with the conventional vibration amplitude magnifying type transducer, an ultrasonic horn as the mechanical vibration magnifying member and a transducer as the ultrasonic transducer portion are each constructed to have an independent half-wavelength fundamental resonance system and coupled in series to meet the respective resonance frequency. Therefore, when a machining tool is attached to the distal end of the ultrasonic horn, it has been necessary to predetermine the variation in the resonance frequency of the horn which would be caused by the addition of the equivalent mass and to correct the shape and dimension of the horn accordingly. Such correction involves various problems which require enormous labor and experience. Thus, it has been difficult to attach ultrasonic machining tools of diversified shapes and dimensions. In contrast, the transducer construction of the third embodiment allows replacement among machining tools of various shapes and dimensions and thus has a practically extremely great advantage.

Figure 5A:
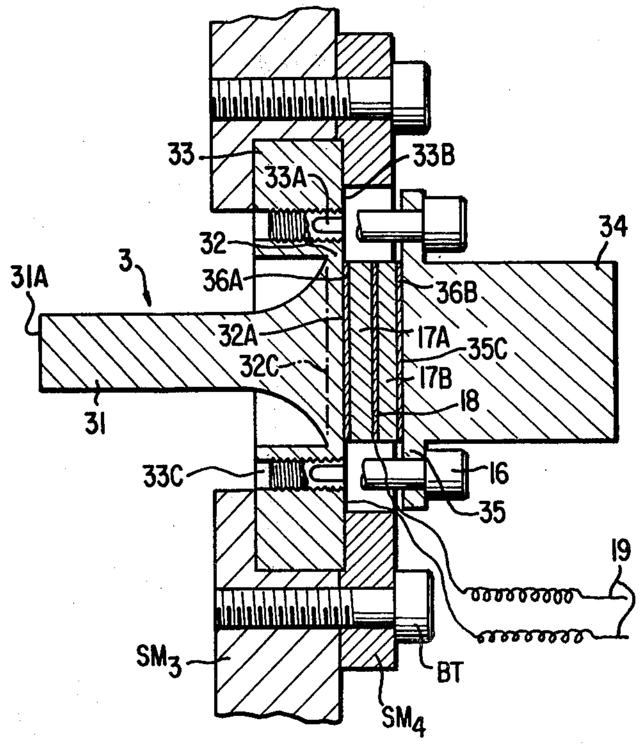
FIGS. 5*a*–5*c* are series of views showing a fourth embodiment of the ultrasonic transducer according to the invention.
Figure 5B:
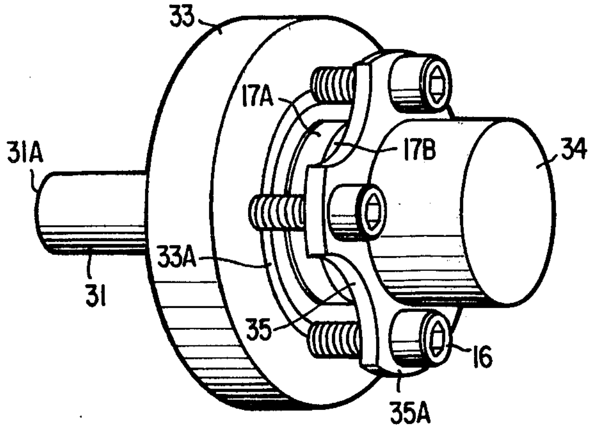
Figure 5C:
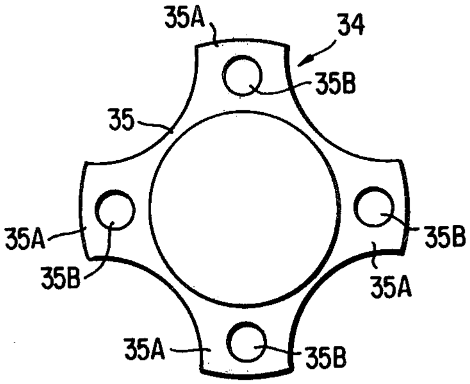

The present invention is now described by way of a fourth embodiment shown in FIGS. 5*a*–5*c*. The feature of the vibration amplitude magnifying type transducer of the fourth embodiment resides in that the mechanical vibration magnifying member 3 and an annular rigid body 33 are formed integrally (the fourth aspect of the invention), the mechanical vibration magnifying member 3 having a flange 32 which is formed as an element contiguously engaged with the annular rigid body 33, and in that the flange of the backing block is modified into a petal type flange 35 (the fifth aspect of the invention).

The transducer of the fourth embodiment has a mechanical vibration magnifying member 31 which consists of a stepped type horn having at its base end a flange which is linked contiguously and integrally with the annular rigid body 33. The annular rigid body which has a structure contiguous to the mechanical vibration magnifying member is in the form of a thick annular plate with sufficient rigidity and weight. The annular rigid body 33 is provided with an annular groove 33A which extends from a flat surface 33B thereof in a manner that it surrounds the sectional circular base plane 32C which is located at the node of the longitudinal vibration of the mechanical vibration magnifying member, in the proximity to the circumference of the sectional base plane 32C, and has an annular groove 33A of a depth which at least reaches an imaginary plane on the extension of the sectional base plane 32C, thereby defining a small-diameter flange 32 of the mechanical vibration magnifying member 3 and a flat surface 32A which serves as its mechanical vibration input end.

In this manner, the flange 32 of the mechanical vibration magnifying member constitutes an element contiguous to the annular rigid body 33 and engaged therewith through a small annular sectional area which surrounds the sectional base plane 32C of the mechanical vibration magnifying member. The annular rigid body is further provided with four tapped holes 33C in equally spaced relations along the annular groove 33A for threaded engagement with a corresponding number of bolts 16 which secure piezoelectric elements 17A and 17B of the ultrasonic transducer portion and the backing block 34. The backing block 34 is provided in the form of a cylindrical column which has, formed integrally at its base end, a petal type flange 35 with a plural number of support arms 35A which serve as fixing means. The petal type flange 35 has the support arms 35A in symmetrical positions with respect to the axis of the backing block, each support arm being connected to adjacent support arms through an arcuate lateral surface. The flange 35 has a thickness which provides a predetermined bending rigidity to act as a leaf spring.

The support arms 35A of the flange 35 are provided with through-holes 35B for receiving four bolts 16 which secure the backing block 34 in position. The flange of the mechanical vibration magnifying member 3 and the opposing flange 35 of the backing block 34 are tightly and integrally fastened to each other through the annular rigid body 33 which is integrally engaged with the mechanical vibration magnifying member and a number of bolts 16 which is threaded into the tapped holes 33C of the annular rigid body, sandwiching therebetween piezoelectric elements 17A and 17B of solid disc form and an electrode 18 which constitute the ultrasonic transducer section, and soft metal sheets 36A and 36B of aluminum, copper or the like. The piezoelectric elements 17A and 17B and the electrode 18 are retained and axially compressed between the opposing flat surface of the flanges 32 and 35. The piezoelectric elements 17A and 17B are connected to an ultrasonic oscillator (not shown) and have the respective positive poles disposed face-to-face on opposite sides of the electrode 18. Their negative poles are uniformly held in intimate contact with the flat surface 32A of the flange 32 of the mechanical vibration magnifying member and the flat surface 35C of the flange 35 of the backing block through the metal sheets 36A and 36B, respectively, under static compressive force which is applied by the flange 35 of the backing block acting as a leaf spring.

In this instance, the mechanical vibration magnifying member 3, piezoelectric elements 17A and 17B, electrode 18, metal sheets 36A and 36B, and backing block 34 integrally vibrate at the predetermined frequency, the dimensions of the respective parts being determined such that the transducer resonates in its entirety in the half-wavelength fundamental longitudinal vibration with a nodal plane at the sectional base plane 32C of the mechanical vibration magnifying member 3 and at the small annular sectional area which circumvents the sectional base plane 32C in the engaged portions of the mechanical vibration magnifying member 3 and the annular rigid body 33.

More specifically, the length of the mechanical vibration magnifying member 3 from its mechanical vibration output end 31A and to its sectional base plane 32C, at the nodal plane of its half-wavelength longitudinal resonance vibration, corresponds to one-quarter wavelength of the vibration mode in which the transducer resonates at the predetermined frequency. The backing block 34 has a length which is determined by calculations and experimentally such that the transducer is held in its entirety in half-wavelength longitudinal resonance vibration with a nodal plane of vibration at the sectional base plane 32C and the small annular sectional area which circumvents the justmentioned sectional base plane. Similarly to the first embodiment, the reference numeral 19 designates lead wires which are connected to the electrode plate 18 and annular rigid body 33 for electric oscillation input.

In a manner similar to the first embodiment, the vibration amplitude magnifying type ultrasonic transducer of the fourth embodiment converts the electric oscillations which are applied from an external ultrasonic oscillator into mechanical vibrations and magnifies the amplitude of the vibration, thereby putting the mechanical vibration output end 31A of the transducer in ultrasonic vibration of large amplitude to generate ultrasonic waves. In this embodiment, the mechanical vibration magnifying member 3 and the annular rigid body 33 are formed integrally with each other, and the small-diameter flange 32 of the mechanical vibration magnifying member is provided as an element contiguous to the annular rigid body 33 to support the flange 32 in a more rigidly restricted manner. This construction completely precludes the cracking of the piezoelectric element such as PZT and ensures extremely stabilized operations even when the trasducer is continuously put in vibrations of large amplitude over a long period of time, without causing transitional variations in the electric impedance and the resonance frequency. In addition, in case the transducer is securely fixed on an external support member having a rigid structure, there can also be obtained the effects of suppressing drops in the resonance vibration characteristics of the transducer and energy losses due to the fixed support, in the same or better degree as compared with the foregoing first to third embodiments.

In the transducer of the present embodiment, the mechanical vibration magnifying member and the annular rigid body are integrally formed, so that perfectly constant restricting conditions are maintained for the flange of the mechanical vibration magnifying member which has an important role of dictating the characteristics of the transducer. This permits of a constant and stabilized operation of the transducer over a long period of time, and, in the production of the transducer, of fabrication and assembly of products of constant and uniform quality.

Furthermore, the transducer of this embodiment has a backing block 34 with a petal type flange with a plural number of support arms 35A and arcuate notches between the respective support portions which are securely fixed by bolts, thereby contributing to ensure stabilized operation of the transducer as a whole and to increase the efficiency of the transducer all the more.

More particularly, the backing block in the first to third embodiments (cf. FIG. 2*b*) has a flange 15 of disk form adapted for the fixed support by a number of bolts 16. During operation of the transducer, the flange 15 is held in flexural vibration at the same frequency as the resonance vibration of the transducer. However, in some cases unnecessary flexural vibration is imparted to the flange portions 15C between the fixed support portions by the respective bolts. The flexural vibration is superposed on the resonance vibration of the transducer as a whole to lower the vibrational characteristics of the transducer though in a slight degree. This problem is completely solved in the present embodiment with a backing block which has a notch in the flange portions between the adjacent fixed support points as described hereinafter to preclude the unnecessary vibrations of the so-called spurious mode which would otherwise be generated concurrently with the longitudinal vibration of the transducer, the flange acting as an element of the transducer in ideal longitudinal resonance vibration to ensure stabilized operation and at the same time to improve the efficiency of the transducer all the more.

The provision of notches in the intermediate flange portions permits to increase the thickness in the fixed support portions without increasing the weight of the flange of the backing block, thereby increasing the bending rigidity of the flange and thus suppressing flexural vibration of the spurious mode so that no effect of such flexural vibration is exerted on the piezoelectric elements.

Further, in the transducer according to the fourth embodiment, the annular rigid body 33 is gripped by bolts BT between the annular support member SM4 with tapped holes and the fixed support member SM3 with tapped holes and with annular L-shaped stepped portion which engages with the outer periphery of the annular rigid body 33, so that the vibration of the transducer is free of any restriction as in the second embodiment.

Figure 6:
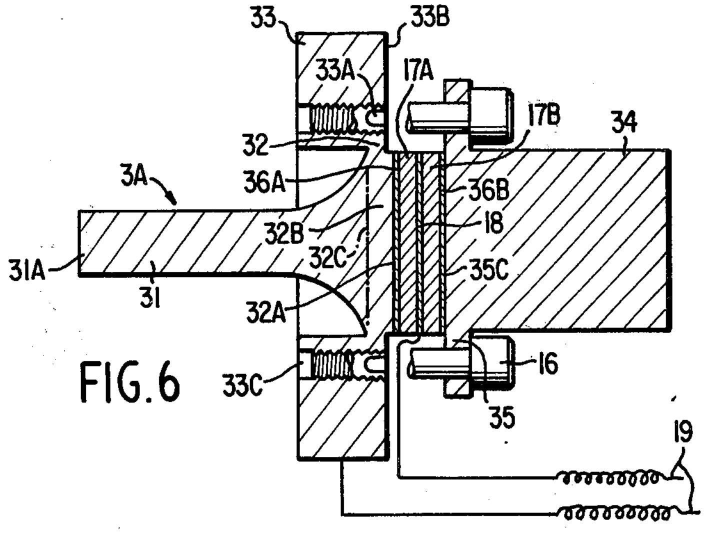
FIG. 6 is a sectional view of a fifth embodiment of the ultrasonic transducer according to the invention.

The fourth embodiment may be modified according to the fifth embodiment shown in FIG. 6. The feature of the vibration amplitude magnifying type ultrasonic transducer of the fifth embodiment different from those of the fourth embodiment will be described. In the following description, those parts which are common to the fourth embodiment are designated by common reference numerals and their explanations are omitted.

In this embodiment, the mechanical vibration magnifying member 3A is formed integrally with the annular rigid body and has a flange 32, at its base end portion, which is formed as an element contiguously engaged with the annular rigid body 33. The flange 32 has at its central end portion a circular projection integrally formed therewith the third aspect and having a circular flat surface 32A to be engaged with piezoelectric element. Thus, piezoelectric elements 17A, 17B, electrode 18 and metal sheets 36A, 36B which constitute the ultrasonic transducer portion are compressedly held between the circular flat surface 32A of the circular projection 32B and the flat surface 35C of the flange 35 of the backing block. The circular projection 32B of this embodiment has its lateral surface connected with the flange portion by a smooth curve, and the circular flat surface 32A which projects from the flange has a substantially same outer diameter as the piezoelectric element 17A to contact intimately and uniformly with the piezoelectric element 17A through the metal sheets 36A and 37B. The circular projection 32B serves to increase the wall thickness of the flange portion which is in contact with the piezoelectric element 17A, thereby increasing the bending rigidity at that flange portion to a considerable degree and effectively preventing curved vibrational displacement which would otherwise be caused to the circular flat surface 32A. The provision of the circular porjection 32B also serves to improve the abutting engagement with the piezoelectric element, gripping uniformly the entire body of the piezoelectric element.

Thus, the transducer of this embodiment can prevent cracking of the piezoelectric elements such as PZT in a more assured manner. This effect becomes more prominent especially in case of a transducer of large power which has a ultrasonic driving portion using piezoelectric element discs of large diameter, allowing continuous and stable vibrating operations of large amplitude over a long period of time without causing transitional variations in electric impedance as well as in resonance frequency. In addition to the above effect, the present embodiment has the same excellent effects as in the fourth embodiment.

Figure 7:
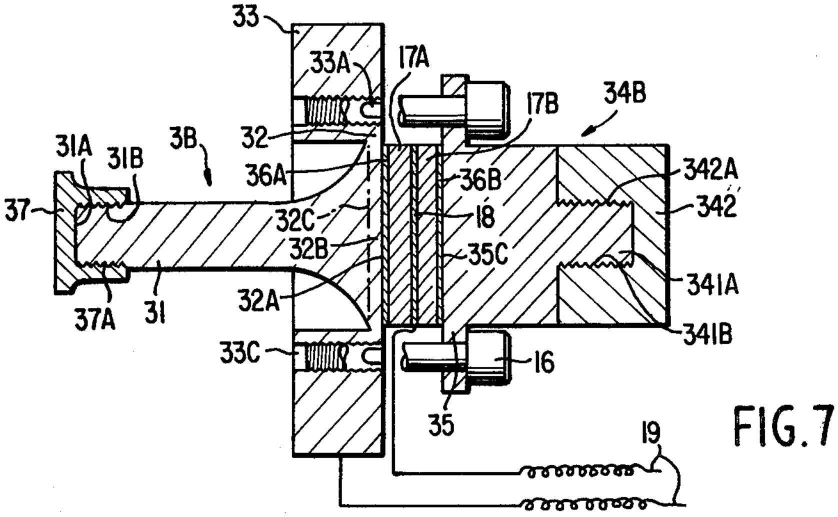
FIG. 7 is a sectional view of a sixth embodiment of the ultrasonic transducer according to the invention.

Alternatively, the above-described fourth embodiment may be modified into the form which is shown as a sixth embodiment in FIG. 7. In the following description of the vibration amplitude magnifying type ultrasonic transducer of the sixth embodiment, those parts which are common to the fourth embodiment are designated by common reference numerals and their explanations are omitted. The feature of the vibration amplitude magnifying type ultrasonic transducer of of the sixth embodiment resides in that the mechanical vibration magnifying member 3B is formed integrally with the annular rigid body 33 and has a flange which is formed as an element contiguously engaged with the annular rigid body 33, in a manner similar to the fourth embodiment. The mechanical vibration magnifying member 3B is provided at its front end with a threaded coupling portion 31B to attach in a replaceable manner a variety of ultrasonic vibratory discs and ultrasonic machining tools. The backing block 34B is provided with a threaded projection of a small diameter and a rear block which replaceably engages with the threaded projection. By making the rear end portion of the backing block 34B replaceable, it becomes possible to change the length of the block easily in accordance with the equivalent mass of the ultrasonic vibratory disc or the ultrasonic machining tool in a manner to satisfy the resonance conditions of the transducer.

More particularly, the mechanical vibration output portion 31 of this embodiment is provided with a threaded coupling portion 31B at the distal output end thereof to allow attachment of various ultrasonic vibratory discs and machining tools, and the backing block 34B is composed of a main block 341 and a resonance adjusting block 342. The main block 341 consists of a cylindrical column member with a petal type flange integrally formed at its base end in the same manner as in the fourth embodiment, and a cylindrical portion of reduced diameter 341A integrally formed at the other end. The cylindrical reduced diameter portion 341A is formed coaxially with the main block 341 and provided with screw threads 341B on its circumference for securing the resonance adjusting block 342.

The resonance adjusting block 342 consists of a cylindrical column of the same diameter as the aforementioned main block body 341 and is provided with female screw portion 342A about its axis for engagement with the external threads on the cylindrical reduced diameter portion 341A of the main block body. The resonance adjusting block 342 is tightly secured to the main block body 341 through the female screw portion 342A. The length of the backing block 34B can thus be changed by replacing the resonance adjusting block 342. The reference numeral 37 in this embodiment designates an ultrasonic vibratory disc with a threaded mounting portion 37A which is threaded on the coupling screw portion 31B at the distal end of the mechanical vibration magnifying member 31. The ultrasonic vibratory disc serves to increase the vibrational area at the mechanical vibration output end of the transducer and to generate ultrasonic waves from a vibratory surface of an increased area. The disc is securely fixed at the distal end of the mechanical vibration output member 31 and vibrates integrally therewith.

In other respects, the transducer of the presnet embodiment is the same as the above-described fourth embodiment. The mechanical vibration magnifying member 3B is formed integrally with the annular rigid body 33 and has a flange of small diameter 32 which is formed as an element contiguously engaged with the annular rigid body 33. Therefore, the flange 32 is more securely supported by the annular rigid body 33 in a rigid and restricted manner, and therefore the transducer in its entirety resonates in half-wavelength fundamental longitudinal resonance vibration mode with a nodal plane at the sectional base plate 32C of the mechanical vibration magnifying member 3B and at the annular sectional area where the flange 32 of the mechanical vibration magnifying member and the annular rigid body 33 are engaged with each other. More specifically, the length of the mechanical vibration magnifying member 3B from its mechanical vibration output end 31A to its sectional base plane 32C, i.e., the nodal plane of the half-wavelength longitudinal resonance vibration, corresponds to one-quarter wavelength of the vibration mode in which the transducer resonates at the required frequency with the ultrasonic vibratory disc 37 attached thereto. Whereas, the backing block 34B can be changed into various lengths by replacing the resonance adjusting block 342 and adjusted such that the transducer in its entirety is put in half-wavelength longitudinal resonance vibration with a nodal plane located at the sectional base plane 32C. This, in addition to the effects common to the above-described fourth embodiment, the transducer of the present embodiment has an advantage that the length of the backing block can be adjusted easily by replacing the resonance adjusting block 342 to conform with the resonance of the transducer. Even in a case where an ultrasonic vibratory disc or machining tool of a dimension different from that of the vibratory disc employed in the present invention is attached to the distal end of the mechanical vibration magnifying member, the desired resonance of the transducer can be effected in a facilitated and secure manner simply by replacing the resonance adjusting block 342 to adjust the length of the backing block in accordance with the equivalent mass of the attached disc or tool and the load which is imposed on the mechanical vibration magnifying member.

Alternatively, the above-described fourth embodiment may be modified into another form which is shown as a seventh embodiment in FIG. 8(*a*) (*i*). The feature of the vibration amplitude magnifying type ultrasonic transducer of the seventh embodiment also resides in that the mechanical vibration magnifying member 3C is formed integrally with the annular rigid body 33 (the fourth aspect of the idnvention) and has at its base end a flange 32 which is formed as an element contiguously engaged with the annular rigid body 33 to let the latter support the former by perfectly rigid engagement therewith. The mechanical vibration magnifying member 3C is constituted by two component elements, viz., a front end portion 311 and a rear end portion 312 of the amplitude magnifying portion. The two component parts are fastened integrally to each other by a bolt 313 which is passed axially therethrough to form a one-quarter wavelength resonance horn. Whereas, the backing block 34C is constituted by two component elements, a main block body 343 and a resonance adjusting block 344, which are fastened integrally to each other by a coupling bolt 345. Here, the amplitude magnifying end portion 311 of the vibration magnifying member and the resonance frequency of the seventh embodiment can be changed arbitrarily by changing their length.

The mechanical vibration magnifying member of the transducer of the seventh embodiment has a mechanical vibration output portion 31 in the form of a stepped horn with a flange 32 provided at the base end thereof. The flange 32 is contiguously and integrally engaged with the annular rigid body 33 in the same manner as in the fourth embodiment. The mechanical vibration output portion 31 has an its major components the front end portion 311 and the rear end portion 312 of the amplifying horn which have tapped bores along the entire lenghts thereof in threaded engagement with the bolt 313 which is passed therethrough. The bolt 313 fastens the front end portion 311 and the rear end portion 312 of the amplifying horn securely and integrally to each other to provide one-quarter wavelength longitudinal resonance vibration mode.

The annular rigid body 33 consists of a thick annular support member with sufficient rigidity and weight and is integrally connected to the flange 32 which circumvents the base end portion of the rear portion 312 of the amplifying horn.

More particularly, the flange 32 surrounds the sectional base plane 32C, i.e., the nodal plane of the longitudinal vibration of the mechanical vibration magnifying member 3C, at the joint between the annular rigid body 33 and the mechanical vibration magnifying member 3C, and the annular rigid body 33 has on its end face 33B an annular groove 33A which is located close to the outer periphery of the sectional base plance 32C and which a depth at least reaching an imaginary plane extended from the sectional base plane 32C. The flange 32 is thus formed as a member contiguous to the annular rigid body. The flange 32 which surrounds the base end of the mechanical vibration magnifying member is formed in small diameter and rigidly and uniformly engaged with the annular rigid body 33 in the annular small sectional area which is located on a plane extended from the sectional base plane 32C, i.e., the nodal plane of the longitudinal vibration.

Further, the mechanical vibration magnifying member 3C is provided at its base end with a circular projection 32B which has a circular flat surface 32A to serve as a mechanical vibration input end. The annular rigid body 33 is provided with a plural number of tapped holes 33C in circumferentially equally spaced positions and in alignment with the aforementioned annular groove 33A, for threadingly receiving a corresponding number of bolts 16 which fix the ultrasonic transducer portion including piezoelectric element 17A and 17B securely to the backing block 34C.

Figure 8A:
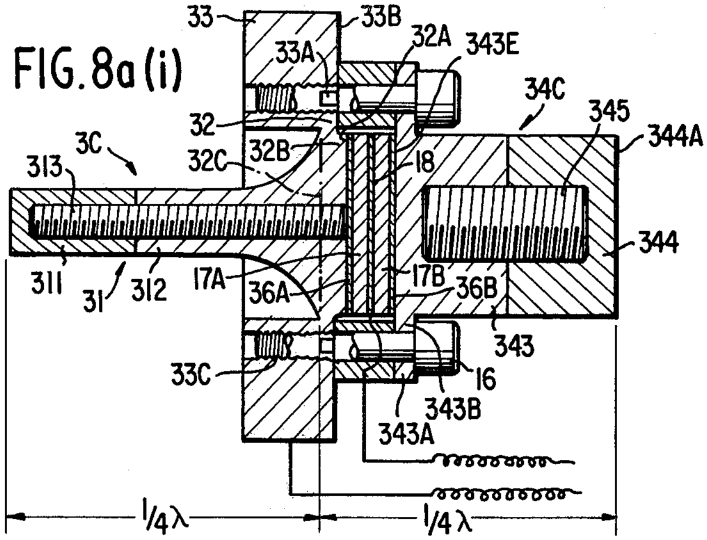
FIGS. 8(*a*) (*i*) and 8(*a*) (*ii*) are a diagrammatic view and a graphic illustration of vibrational displacements in various portions, respectively, of a seventh embodiment of the ultrasonic transducer according to the invention.
FIGS. 8*b*–8*d* show various parts of the embodiment of FIG. 8(*a*) (*i*)
Figure 8B:
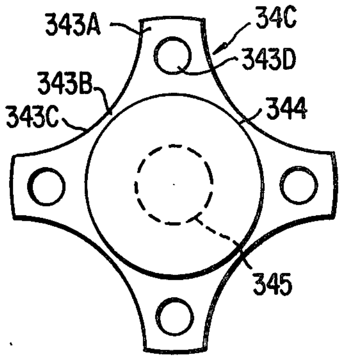
Figure 8C:
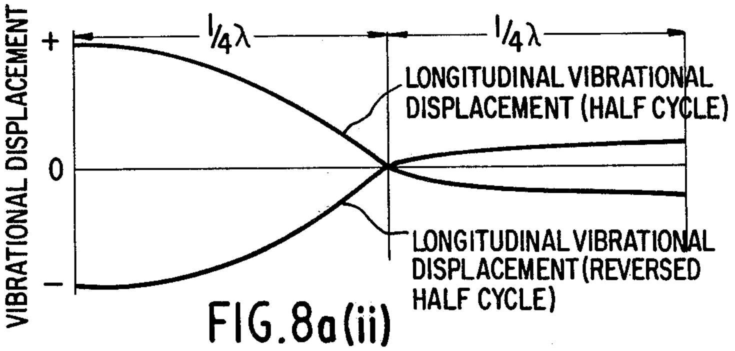
Figure 8C:
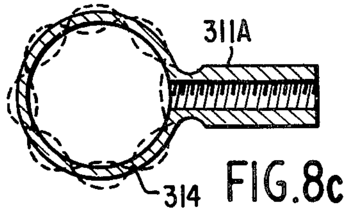
Figure 8D:
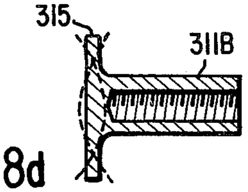

The backing block 34C consists, as shown in FIG. 8*b*, of a main block 343 of a cylindrical column and a resonance adjusting block 344 similarly in the form of a cylindrical column, and a coupling bolt 345 which joins the two blocks securely to each other. The main block body 343 and the resonance adjusting block 344 are each provided with an internally threaded axial bore for threadingly receiving the bolt 345. The two blocks are tightly and integrally fastened to each other by the bolt 345 to act as a single backing block in the resonance vibration. The main backing block 343 is provided integrally at its base end with a petal type flange 343B which has four support arms 343A as fixing portions. The support arms 343A of the petal type flange 343B are provided symmetrically with respect to the axis of the backing block and adjacent support arms are connected by an arcuate lateral surface 343C. The flange 343B has a wall thickness which has a suitable bending rigidity for acting as a leaf spring. Furthermore, the four support arms 343A of the flange 343B are each provided with a through hole 343D for receiving four bolts 16 which secure the backing block 34C in position.

The aforementioned annular rigid body 33 which is engaged integrally with the mechanical vibration magnifying member 3C and the petal type flange 343B of the backing block 34C which opposingly faces the annular rigid body are tightly fastened to each other by the bolts 16 which are threadingly engaged with the female screw portions 33C of the annular rigid body 33, sandwiching therebetween piezoelectric elements 17A and 17B of solid disc form, electrode plate 18 and soft metal sheets 36B and 37B such as of aluminum or copper, which constitute the ultrasonic transducer assembly. The piezoelectric elements 17A and 17B, and electrode plate 18 are axially compressed between the circular flat surface 32A at the base end of the mechanical vibration magnifying member 3C and the flat surface 343E on the flange of the backing block 34C. In the above construction, the circular flat surface 32A serving as a mechanical vibration input end of the mechanical vibration magnifying member 3C, soft metal sheet 36A, piezoelectric elements 17A, electrode plate 18, another piezoelectric element 17B and another soft metal sheet 36B are secured to each other by an adhesive which is applied to the contacting surfaces of the respective elements to provide more intimate and secure contact with each other. The piezoelectric elements 17A and 17B are connected to an ultrasonic oscillator (not shown) and have the respective positive poles disposed face-to-face on opposite sides of the electrode plate 18, while their negative poles are held in uniform contact with the flat surface 32A at the base end of the mechanical vibration magnifying member and the flat surface 343E on the flange of the backing block, respectively, through the metal sheets 36A and 36B, under the static compressive force which is applied by the petal type flange 343B of the backing block which acts as a leaf spring.

The mechanical vibration magnifying member 3C, piezoelectric elements 17A and 17B, electrode plate 18, metal sheets 36A and 36B, and backing block 34C vibrate integrally at the predetermined frequency, the respective parts being dimensioned such that the transducer in its entirety is held in half-wavelength fundamental longitudinal resonance vibration with a nodal plane at the sectional base plane 32C of the mechanical vibration magnifying member and at the annular small sectional area which circumvents the sectional base plane 32C at the joint between the mechanical vibration magnifying member 3C and the annular rigid body 33. More precisely, the length of the mechanical vibration magnifying member 3C from its distal end of the front end portion 311 of the amplifying horn to its sectional base plane 32C, i.e., the nodal plane of the half-wavelength longitudinal resonance vibration, corresponds to one-quarter wavelength of the vibrational mode in which the transducer resonates at the predetermined frequency, while the backing block 34C has a length which is determined such that the distance from the sectional base plane 32C of the mechanical vibration magnifying member 3C to the rear end face 344A of the resonance adjusting block 344 of the backing block corresponds to one-quarter wavelength of the resonance vibration mode in conformity with the predetermined resonance frequency.

With the vibration amplitude magnifying type ultrasonic transducer of this embodiment, the front end portion 311 of the amplifying horn and the resonance adjusting block 344 of the backing block are replaceable, so that it is possible to change their lengths and to change the resonance frequency arbitrarily in producing the ultrasonic waves. For instance, the ultrasonic transducer of FIG. 8 is designed to produce ultrasonic waves of 38.0 KHz with use of piezoelectric elements of 20 discs. The front end portion 311 of the magnifying horn is 7.3 mm in diameter and 15 mm in length and made of steel material, the length of the mechanical vibration magnifying member 3C from its front end to its base plane 32C being 33.7 mm. On the other hand, the resonance adjusting block 344 of the backing block is 20 mm in diameter and 12 mm in length and made of steel, the distance from the sectional base plane 32C to the rear end of the resonance adjusting block 344 being 34.3 mm. Designed in this manner, the ultrasonic transducer of this embodiment has the node of vibration at the sectional base plane 32C and the mechanical vibration output portion 31 vibrates in one-quarter longitudinal resonance vibration mode while the backing block 34C vibrates similarly in one-quarter longitudinal resonance vibration mode, the transducer as a whole resonating in half-wavelength resonance vibration mode to produce ultrasonic waves of 38.0 KHz, as shown in FIG. 8(*a*) (*ii*). In order to change the frequency of the ultrasonic waves generated by this transducer, it suffices to change the lengths of the front end portion 311 of the amplifying horn and the resonance adjusting block 344. More specifically, when it is desired to produce ultrasonic waves of 20 KHz, the front end portion 311 of the horn and the resonance adjusting block 344 are replaced by similar elements having lengths of 45.1 mm and 42.1 mm, respectively. In other words, the node of vibration of the transducer is located at the sectional base plane 32C, and the mechanical vibration output portion 31 and the backing block are formed in lengths suitable for 20 KHz one-quarter wavelength longitudinal resonance vibration mode, respectively.

In this transducer, the horn with the front end portion 311 can easily be replaced by a horn which has a front end portion 311A with a cylindrical vibratory member 314 which undergoes flexural vibration of the mode indicated by dotted line in FIG. 8(*c*) or by a horn which has a front end portion 311B with a disc-like vibratory member 315 which undergoes flexural vibration of the mode as indicated by dotted line in FIG. 8(*d*), for producing ultrasonic waves through those vibratory members. That is, when a vibratory member is attached to the front end of the horn of the vibration amplitude magnifying type transducer of this embodiment, the correction of the resonace conditions which is necessitated by the addition of the equivalent mass of the attached member can be effected in a facilitated and secure manner, simply by changing and adjusting the resonance adjusting block 344 and the front end portion 311 of the amplifying horn into lengths which satisfy the resonance conditions.

Similarly to the fourth to sixth embodiments, the vibration amplitude magnifying type ultrasonic transducer of this embodiment has the mechanical vibration magnifying member 3C formed integrally with the annular rigid body 33 of large thickness which has sufficient rigidity and weight, and the small diameter flange 32 of the mechanical vibration magnifying member is provided as an element contiguous to the annular rigid body 33 to support the flange 32 more securely in a rigid and restricted manner at a position on a plane extended from the sectional base plane 32C at the nodal plane. The annular groove 33A which circumvents the periphery of the flange 32 prevents restrictions on the radial vibrational displacements which necessarily occur concurrently with the longitudinal vibration of the transducer. Therefore, it becomes possible to obtain ideal longitudinal resonance vibration with its node at the entire area of the sectional base plane 32C, while completely preventing cracking of the piezoelectric elements such as PZT. According to a continuous endurance test (still continued at present) by the present inventors, it has been confirmed that extremely stabilized continuous vibrating operations of large amplitude over a long time period exceeding 5000 hours is possible without entailing transitional variations in electric impedance and resonance frequency.

Furthermore, the vibration amplitude magnifying type transducer of this embodiment has the small-diameter flange 32 of the mechanical vibration magnifying member engaged with the annular rigid body 33 ideally at the nodal plane of the longitudinal vibration, along with the annular groove 33A which surrounds the nodal plane of the longitudinal vibration, so that the longitudinal vibration of the transducer and the radial vibration which occur concurrently with the longitudinal vibration are prevented from being directly transmitted to the annular rigid body 33. The annular rigid body acts as a rigid structure of zero vibrational displacement in the vibration system of the transducer so that it is possible to mount the transducer rigidly on other structures or on an external support structure through the annular rigid body without lowering the resonance vibration characteristics and operating characteristics of the transducer.

In the transducer of this embodiment, the small-diameter flange 32 of the mechanical vibration magnifying member and the annular rigid body 33 are engaged with each other through the small annular area of the flange surface to provide a large fall in acoustic impedance across the mechanical coupling between the flange 32 and the thick-walled annular rigid body to prevent transmission of ultrasonic energy from the flange to the annular rigid body, thereby suppressing to a mininum the dissipative energy loss which would be caused when the transducer is fixedly mounted on an external support structure. The transducer thus can produce ultrasonic waves with extremely high efficiency.

In addition, similarly to the fourth to sixth embodiments, the transducer of the present embodiment employs the backing block 34C which is provided with a petal type flange 343B with a plural number of support arms 343A, that is to say, a discontinued type flange with the required rigidity. This prevents the spurious mode of vibrations which would otherwise be induced to the flange of the backing block, thereby ensuring stabilized drive of the transducer and enhancing all the more the ultrasonic vibration conversion efficiency.

As described hereinbefore, the piezoelectric elemens 17A and 17B, electrode plate 18, and metal sheets 36A and 36B which constitute the drive portion of the transducer are intimately and tightly fastened to each other after applying an adhesive to the contacting surfaces of respective elements to preclude existence of any fine interstice or gap therebetween. This arrangement allows secure transmission of the pressure of ultrasonic vibrations and enhances all the more the efficiency of conversion of electric oscillations into ultrasonic mechanical vibrations.

In the transducer according to the present invention, the drive portion which is an important part of the transducer is located at a position in the vacinity of the node of longitudinal vibration of the transducer, where the displacement due to the ultrasonic longitudinal vibration is closed to zero. In this condition, existence of any fine gap or interstice is not allowed in order to transmit the ultrasonic vibrating power effectively to the mechanical vibration magnifying member and the backing block. In this connection, the transducer of the seventh embodiment can perform the intended effects in a satisfactory manner.

It will be appreciated from the foregoing description that, in an ultrasonic transducer having an ultrasonic transducer portion, including piezoelectric elements and so forth, interposed between first and second cylindrical members which are fastened to each other by clamping means such as bolts to grip therebetween the ultrasonic transducer portion, the present invention provides a flange of reduced diameter provided on a first cylindrical member of the mechanical vibration magnifying member, and an annular rigid body of large sectional area having a stepped portion in engagement with the flange of reduced diameter and forming an annular gap between the stepped portion and the circumference of the flange of reduced diameter, the annular rigid body being fastened to a flange of the second cylindrical member by clamping means. With this arrangment, by reducing the diameter of the flange of the first cylindrical member, the intrinsic frequency of the flange portion is increased considerably and its bending displacement is suppressed to a minimum, preventing flexural vibrations which would otherwise be produced at the flat surface and the flange of reduced diameter of the first cylindrival member which are in abutment against the ultrasonic transducer portion and at the same time precluding rupture or cracking of the piezoelectric elements to allow continuous ultrasonic vibrating operations of large amplitude over a long period.

Figure 9A:
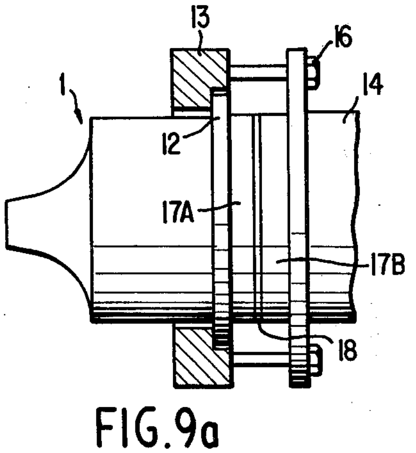
FIGS. 9(*a*) to 11 are diagrammatic view showing modifications of the ultrasonic transducer according to the invention.
Figure 9B:
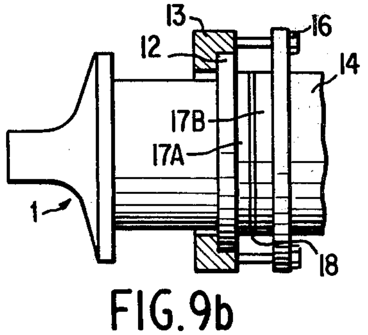

In all of the embodiments described hereinbefore, the present invention has been applied to an ultrasonic transducer in which, for the sake of compactness, the metal blocks which hold the piezoelectric elements are adapted to perform the mechanical vibration magnifying function. However, this invention may be applied to an ultrasonic transducer of the type in which, as shown in FIGS. 9(*a*) and 9(*b*), the piezoelectric elements are sandwiched between two metal blocks serving as the first and second cylindrical members one of which has a mechanical vibration magnifying member (horn) integrally formed or secured at its output end. In these figures, those parts which are common to the foregoing are designated by common reference numerals.

Figure 10:
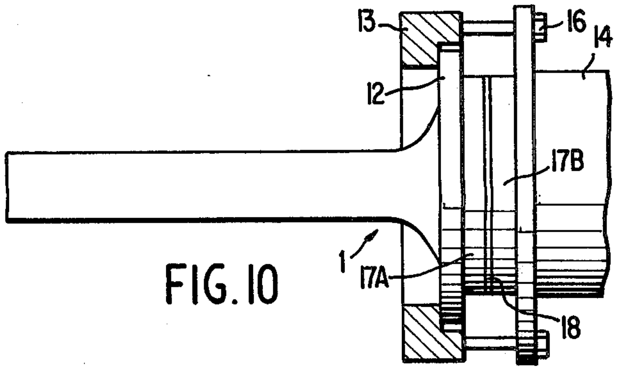

Moreover, for use in a placed which is exposed to a high temperature, for instance, heat from a burner or the like, the transducer of the invention may be modified into the form as shown in FIG. 10, wherein the horn which is formed integrally with the first cylindrical member to act as a mechanical vibration magnifying portion is sufficiently elongated to keep the piezoelectric elements at a distance from the heat source. In the figure, those parts which are common to the foregoing embodiments are designated by common reference numerals.

Figure 11:
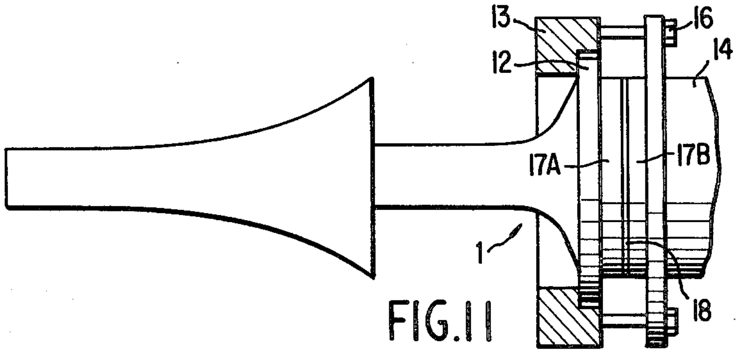

Furthermore, the present invention may be applied to a transducer the first cylindrical member of which, as shown in FIG. 11, has in series two or more mechanical vibration magnifying portions for magnifying the mechanical vibration all the more. In the figure, those parts which are common to the preceding embodiments are designated by common reference numerals.

For the mechanical vibration magnifying portion to be formed or provided on the first cylindrical member, the foregoing embodiments employed by way of example an exponential type horn, a stepped type horn and a conical type horn. However, this invention is not restricted to those type and may be applied to horns of other types including catenary types horns and Fourier type horns.

It should be appreciated that the present invention permits of addition of various alterations and changes without departing from the scope of the invention defined in the appended claims.

What is claimed as new and desired to be secured by letters patent of the United States is:

1. An ultrasonic transducer comprising:

a first cylindrical member including a mechanical vibration amplifying part formed in symmetry around the axis thereof and having a gradually increased cross-sectional area toward a base portion thereof, said base portion being formed with an axially thinnest walled annular portion and a flat surface perpendicular to the axis thereof, and an annular rigid part integrally formed with said mechanical vibration amplifying part coaxially therewith, said annular rigid part abutting said thinnest walled portion and being extended from said thinnest walled portion axially and radially outwardly to have sufficient rigidity and weight, and said annular rigid part being provided, in the proximity of said thinnest walled portion, with an annular groove which axially extends from the surface of said annular rigid part to a depth which at least corresponds to the axial thickness of said thinnest walled portion of said mechanical vibration amplifying part;

a second cylindrical member comprising a backing block of a cylindrical body, the base portion of which is formed with a flange and a flat surface perpendicular to the axis thereof;

an ultrasonic transducer portion interposed between said flat surfaces of said first and second cylindrical members and including a pair of piezoelectric elements having flat surfaces perpendicular to the axis of said first and second cylindrical members, and an electrode plate interposed between said pair of piezoelectric elements; and fastening means for pressingly abutting said flat surfaces of said piezoelectric elements against flat surfaces of said first and second cylindrical members and integrally clamping said annular rigid part and said flange of said second cylindrical member to each other in a manner to circumvent said annular groove and said ultrasonic transducer portion, whereby cracking of piezoelectric elements is prevented to ensure stabilized operations without transitional variations in electric impedance and resonance frequency and to allow continuous vibrating operations of large amplitude over a long period of time.

2. An ultrasonic transducer according to claim 1, wherein:

said first cylindrical member includes a mechanical vibration amplifying member and an annular rigid member being formed separately, said mechanical vibration amplifying member is integrally formed with a flange of a small diameter slightly projected from said thinnest walled portion of said mechanical vibration amplifying part radially outwardly and having a narrow annular flat surface on the output side of said mechanical vibration amplifying member, said annular rigid member having a flat annular surface on one side thereof to be engaged with said annular flat surface of said flange of said mechanical vibration amplifying member, and said fastening means clamp said annular rigid member and said flange of said second cylindrical member to each other in a manner to circumvent said small-diameter flange, whereby said pair of piezoelectric elements are pressingly abutted against said flat surfaces of said first and second cylindrical members.

3. An ultrasonic transducer according to claim 2, wherein:

said annular rigid member has at the axial end of the inner peripheral wall portion thereof a stepped portion consisting of an annular inner surface formed parallel with the axis thereof and an annular flat bottom surface perpendicular to said axis, said bottom surface of said stepped portion being uniformly engaged with said narrow annular flat surface on said flange of said mechanical vibration amplifying member and said annular inner surface retaining a narrow annular gap around the outer periphery of said flange of said mechanical vibration amplifying member.

4. An ultrasonic transducer according to claim 2 wherein:

said flat surfaces of said annular rigid member and said small-diameter flange are integrally joined together by soldering or welding means.

5. An ultrasonic transducer according to claim 1, wherein:

said flat surface of said mechanical vibration amplifying part is integrally formed with a circular projection axially projected therefrom and having a circular flat surface, and said piezoelectric elements are compressedly held between said circular flat surface of said circular projection and said flat surface of said second cylindrical member, thereby strengthening said flat surface of said first cylindrical member, and further reducing the flexural vibration of said flat surface.

6. An ultrasonic transducer according to claim 1 wherein:

said mechanical vibration amplifying part is selected from the group consisting of an exponential horn, a stepped horn, a conical horn, a Fourier horn and a catenary horn.

7. An ultrasonic transducer according to claim 1 wherein:

said base portion of said first cylindrical member has a disc like shape of small volume.

8. An ultrasonic transducer according to claim 1 wherein:

said base portion of said first cylindrical member has a cylinder shape of large volume.

9. An ultrasonic transducer according to claim 1 wherein:

said base of said mechanical vibration amplifying part is positioned at a nodal plane of a predetermined resonance vibration mode; and said mechanical vibration amplifying part, said annular rigid part, said second cylindrical member, said ultrasonic transducer portion and said fastening means are so dimensioned and constructed that the total length of said transducer coincides with a predetermined wavelength in resonance vibration of a predetermined mode.

10. An ultrasonic transducer according to claim 7, wherein said base portion is positioned at a nodal line of one-quarter wavelength in a half-wavelength longitudinal resonance vibration mode and the total length of said transducer is a half wavelength.

11. An ultrasonic transducer according to claim 8, wherein said base portion is positioned at a nodal line of three-quarter wavelength in one wavelength longitudinal resonance vibration mode, and the total length of said transducer is one wavelength.

12. An ultrasonic transducer according to claim 1 wherein:

said flange of said second cylindrical member is a petal type flange having notches except for those portions which are clamped by said fastening means.

13. An ultrasonic transducer according to claim 1 wherein:

said backing block is provided with a threaded portion for engaging replaceably with an attachment having a corresponding threaded portion.

14. An ultrasonic transducer according to claim 1 wherein:

said mechanical vibration amplifying part is provided with a threaded portion for engaging replaceably with an attachment having a corresponding threaded portion.

15. An ultrasonic transducer according to claim 1 wherein:

said backing block includes a main block body and a resonance adjusting block which are fastened integrally to each other by a coupling bolt.

16. An ultrasonic transducer according to claim 1 wherein:

said mechanical vibration amplifying part includes a front end portion and a rear end portion having tapped bores along the entire lengths which are fastened integrally to each other by a bolt passing therethrough.

17. An ultrasonic transducer according to claim 3, wherein:

said mechanical vibration amplifying member of said first cylindrical member is an exponential type horn and said base portion of said first cylindrical member is formed in a disc like shape of small volume, said flange being projected from an outer peripheral part of said disc like base portion thereof;

said stepped annular rigid member has four threaded axial holes at parts outside the position of said stepped annular inner surface forming said annular gap and has a plurality of axial through-holes into which bolts are inserted to fix said stepped annular rigid member to an annular supporting member;

said second cylindrical member comprises a hat-shaped solid member having a flange of larger diameter than that of said flange of said first cylindrical member, said larger diameter flange having four holes;

said piezoelectric elements of said ultrasonic transducer portion have a disc-like shape, said electrode plate has a thin disc-like shape, said piezoelectric elements and electrode plate are connected to an ultrasonic oscillator, and the diameters of said piezoelectric elements and electrode plate are smaller than that of said flat surface of said first cylindrical member; and said fastening means comprises four bolts respectively inserted into four holes of said flange of said second cylindrical member and said four threaded holes of said annular rigid member.

18. An ultrasonic transducer according to claim 3, wherein:

said mechanical vibration amplifying member of said first cylindrical member is a stepped type horn and said base portion of said first cylindrical member is formed in a disc like shape of small volume, said flange being projected from an outer peripheral part of said disc like base portion thereof and said base portion being provided with a circular projection projecting axially and integrally therefrom and having a circular flat surface which is perpendicular to the axis thereof and which has the same outer diameter as that of said piezoelectric elements;

said stepped annular rigid member has four threaded axial holes at parts outside the position of said stepped annular inner surface forming said annular gap;

said second cylindrical member comprises a hat-shaped solid member having a flange of larger diameter than that of said flange of said first cylindrical member, said larger diameter flange having four holes;

said piezoelectric elements of said ultrasonic transducer portion have a disc-like shape, said electrode plate has a thin disc-like shape, said piezoelectric elements and electrode plate are connected to an ultrasonic oscillator, and the diameters of said piezoelectric elements and electrode plate are smaller than that of said flat surface of said first cylindrical member; and said fastening means comprises four bolts respectively inserted into four holes of said flange of said second cylindrical member and said four threaded holes of said annular rigid member;

and further including supporting means comprising an annular member having a stepped portion to be engaged with the outer periphery of said annular rigid member and having four axial holes, an annular supporting member having four threaded axial holes and four bolts respectively inserted into said four axial holes of said annular member and said four threaded axial holes of said annular supporting member, thereby supporting the ultrasonic transducer by sandwiching said annular rigid member between said annular member and annular supporting member.

19. An ultrasonic transducer according to claim 3, wherein:

said mechanical vibration amplifying member of said first cylindrical member is a conical type horn which is provided with a center bore extending along a longitudinal axis thereof from a tip portion thereof to said base portion and having a bottom portion at said base portion and an internally threaded portion at said tip portion, and said base portion of said first cylindrical member is formed in a disc like shape of small volume, said flange being projected from an outer peripheral part of said disc like base portion thereof;

said stepped annular rigid member is integrally joined at said annular flat bottom surface to said narrow annular flat surface of said flange by soldering or welding means, and has four threaded axial holes at parts outside the position of said stepped annular inner surface forming said annular gap;

said second cylindrical member comprises a hat-shaped solid member having said flange of larger diameter than that of said flange of said first cylindrical member, said larger diameter flange having four holes;

said piezoelectric elements of said ultrasonic transducer portion have a disc-like shape, said electrode plate has a thin disc-like shape, said piezoelectric elements and electrode plate are connected to an ultrasonic oscillator, and the diameters of said piezoelectric elements and electrode plate are smaller than that of said flat surface of said first cylindrical member; and said fastening means comprises four bolts respectively inserted into four holes of said flange of said second cylindrical member, four holes of an annular spacer and said four threaded holes of said annular rigid member;

and further including an ultrasonic machining tool comprising a hollow cylinder having a bottom portion at one end thereof and having a threaded projecting portion at said bottom portion, said threaded projecting portion being fixed to said internally threaded portion at said tip portion of said first cylindrical member.

20. An ultrasonic transducer comprising:

a first cylindrical member including a mechanical vibration amplifying part formed in symmetry around the axis thereof and having a gradually increased cross-sectional area toward a base portion thereof, said base portion being formed with an axially thinnest walled portion and at flat surface perpendicular to the axis thereof, and an annular rigid part integrally formed with said mechanical vibration amplifying part coaxially therewith, said annular rigid part being extended from said thinnest walled portion axially and radially outwardly to have sufficient rigidity and weight, and said annular rigid part being provided, in the proximity of said thinnest walled portion, with an annular groove which axially extends from the surface of said annular rigid part to a depth which at least corresponds to the axial thickness of said thinnest walled portion of said mechanical vibration amplifying part;

a second cylindrical member comprising a backing block of a cylindrical body, the base portion of which is formed with a flange and a flat surface perpendicular to the axis thereof;

an ultrasonic transducer portion interposed between said flat surfaces of said first and second cylindrical members and including a pair of piezoelectric elements having flat surfaces perpendicular to the axis of said first and second cylindrical members, and an electrode plate interposed between said pair of piezoelectric elements; and fastening means for pressingly abutting said flat surfaces of said piezoelectric elements against said flat surfaces of said first and second cylindrical members and integrally clamping said annular rigid part and said flange of said second cylindrical member to each other in a manner to circumvent said annular groove and said ultrasonic transducer portion, wherein said first cylindrical member is one member comprising said mechanical vibration amplifying part of a stepped type horn, said base portion is formed in a disc like shape of small volume, and said annular rigid part which connects to said annular thinnest walled portion of said base portion, and which has an annular axial groove having a predetermined depth provided adjacent to said annular thinnest walled portion to reduce the area of said flat surface of said first cylindrical member contacting said piezoelectric element has four axial threaded holes at positions superposing on said annular groove;

said second cylindrical member comprises a hat-shaped solid member having a petal type flange of larger diameter than that of said flange of said first cylindrical member, said petal type flange having four holes at the projecting part thereof;

said ultrasonic transducer portion comprises said piezoelectric elements having a disc-like shape, said electrode plate having a thin disc-like shape and two circular sheets inserted between said piezoelectric elements and flat surfaces of said first and second cylindrical members, said piezoelectric elements and electrode plate are connected to an ultrasonic oscillator, and the diameters of said piezoelectric elements, electrode plate and two circular sheets are smaller than that of said flat surface of said first cylindrical member; and said fastening means comprises four bolts respectively inserted into four holes of said petal type flange of said second cylindrical member and said four threaded holes of said annular rigid part of said first cylindrical member;

and further including supporting means comprising an annular member having a stepped portion to be engaged with the outer periphery of said annular rigid part and having four axial holes, an annular supporting member having four threaded axial holes and four bolts respectively inserted into said four axial holes of said annular member and said four threaded axial holes of said annular supporting member, thereby supporting the ultrasonic transducer by sandwiching said annular rigid part between said annular member and annular supporting member, whereby cracking of piezoelectric elements is prevented to ensure stabilized operations without transitional variations in electric impedance and resonance frequency and to allow continuous vibrating operations of large amplitude over a long period of time.

21. An ultrasonic transducer according to claim 20, further including a circular projection having a circular flat surface axially and integrally projected with a smooth curve from said flat surface of said base portion thereof, and having the same diameter as that of said piezoelectric element in contact with said projected circular flat surface, thereby to strengthen said circular flat surface contacting said piezoelectric element and further reduce the flexural vibration of said circular flat surface.

22. An ultrasonic transducer comprising:

a first cylindrical member including a mechanical vibration amplifying part formed in symmetry around the axis thereof and having a gradually increased cross-sectional area toward a base portion thereof, said base portion being formed with an axially thinnest walled annular portion and a flat surface perpendicular to the axis thereof, and an annular rigid part integrally formed with said mechanical vibration amplifying part coaxially therewith, said annular rigid part being extended from said thinnest walled portion axially and radially outwardly to have sufficient rigidity and weight, and said annular rigid part being provided, in the proximity of said thinnest walled portion, with an annular groove which axially extends from the surface of said annular rigid part to a depth which at least corresponds to the axial thickness of said thinnest walled portion of said mechanical vibration amplifying part;

a second cylindrical member comprising a backing block of a cylindrical body, the base portion of which is formed with a flange and a flat surface perpendicular to the axis thereof;

an ultrasonic transducer portion interposed between said flat surfaces of said first and second cylindrical members and including a pair of piezoelectric elements having flat surfaces perpendicular to the axis of said first and second cylindrical members, and an electrode plate interposed between said pair of piezoelectric elements; and fastening means for pressingly abutting said flat surfaces of said piezoelectric elements against said flat surfaces of said first and second cylindrical members and integrally clamping said annular rigid part and said flange of said second cylindrical member to each other in a manner to circumvent said annular groove and said ultrasonic transducer portion, wherein said first cylindrical member is one member comprising said mechanical vibration amplifying part of a stepped type horn having a threaded tip portion, said base portion is formed in a disc-like shape of small volume, and said annular rigid part which connected to said annular thinnest walled portion of said base portion, and which has an annular axial groove having predetermined depth provided adjacent to said annular thinnest walled portion to reduce the area of said flat surface of said first cylindrical member contacting said piezoelectric element has four axial threaded holes at positions superposing on said annular groove;

said second cylindrical member comprises a hat-shaped solid member having a petal type flange of larger diameter than that of said flange of said first cylindrical member, and having a small threaded projection coaxially formed therefrom, and an annular member having the same outer diameter as that of said hat-shaped solid member and having a threaded inner wall for engaging with said threaded projection, said petal type flange having four holes at the projecting parts thereof;

said ultrasonic transducer portion comprises said piezoelectric elements having a disc-like shape, said electrode plate having a thin disc-like shape and two circular sheets inserted between said piezoelectric elements and flat surfaces of said first and second cylindrical members, said piezoelectric elements and electrode plate are connected to an ultrasonic oscillator, and the diameters of said piezoelectric elements, electrode plate and two circular sheets are smaller than that of said first cylindrical member; and said fastening means comprises four bolts respectively inserted into four holes of said petal type flange of said second cylindrical member and said four threaded holes of said annular rigid part of said first cylindrical member;

further comprising supporting means comprising an annular member having a stepped portion to be engaged with the outer periphery of said annular rigid part and having four axial holes, an annular supporting member having four threaded axial holes and four bolts respectively inserted into said four axial holes of said annular member and said four threaded axial holes of said annular supporting member, thereby supporting the ultrasonic transducer by sandwiching said annular rigid part between said annular member and annular supporting member, and further including an ultrasonic machining tool comprising a disc shape member having an annular leg portion which has a threaded inner wall to engage with said threaded tip portion of said mechanical vibration amplifying part, whereby cracking of piezoelectric elements is prevented to ensure stabilized operations without transitional variations in electric impedance and resonance frequency and to allow continuous vibrating operations of large amplitude over a long period of time.

23. An ultrasonic transducer according to claim 17, wherein said base portion is positioned at a nodal line of one-quarter wavelength in a half wavelength longitudinal resonance vibration mode and the total length of said transducer is a half wavelength.

24. An ultrasonic transducer comprising:

a first cylindrical member including a mechanical vibration amplifying part formed in symmetry around the axis thereof and having a generally increased cross-sectional area toward a base portion thereof, said base portion being formed with an axially thinnest walled portion and a flat surface perpendicular to the axis thereof, and an annular rigid part integrally formed with said mechanical vibration amplifying part coaxially therewith, said annular rigid part being extended from said thinnest walled portion axially and radially outwardly to have sufficient rigidity and weight, and said annular rigid part being provided, in the proximity of said thinnest walled portion, with an annular groove which axially extends from the surface of said annular rigid part to a depth which at least corresponds to the axial thickness of said thinnest walled portion of said mechanical vibration amplifying part;

a second cylindrical member comprising a backing block of a cylindrical body, the base portion of which is formed with a flange and a flat surface perpendicular to the axis thereof;

an ultrasonic transducer portion interposed between said flat surfaces of said first and second cylindrical members and including a pair of piezoelectric elements having flat surfaces perpendicular to the axis of said first and second cylindrical members, and an electrode plate interposed between said pair of piezoelectric elements; and fastening means for pressingly abutting said flat surfaces of said piezoelectric elements against said flat surfaces of said first and second cylindrical members and integrally clamping said annular rigid part and said flange of said second cylindrical member to each other in a manner to circumvent said annular groove and said ultrasonic transducer portion, wherein said first cylindrical member comprises an annular member having a threaded inner wall and forming a base part of a stepped type horn, said base portion being formed in a disc like shape of small volume, and said annular rigid part being connected to said annular thinnest walled portion of said base portion, said annular rigid part having an annular axial groove with predetermined depth provided adjacent to said annular thinnest walled portion to reduce the area of said flat surface of said first cylindrical member contacting said piezoelectric element and having four axial threaded holes at positions superposing on said annular groove;

a tip cylindrical member having a threaded inner wall and forming a tip part of said stepped type horn; and a bolt having a threaded outer wall for engaging with said threaded inner walls of said annular member and tip cylindrical member in the whole of length to integrally fasten said annular member and said tip cylindrical member;

said second cylindrical member comprises:

a first hollow cylindrical member having a threaded inner wall and a petal type flange of a larger diameter than that of said flange of said first cylindrical member, said petal type flange having four holes at the projecting parts thereof;

a second hollow cylindrical member for adjusting the resonance vibration having a threaded inner wall; and a bolt having a threaded outer wall for engaging with said threaded inner walls of said first and second hollow cylindrical members to integrally fasten the members, said ultrasonic transducer portion comprises said piezoelectric elements having a disc-like shape, said electrode plate having a thin disc-like shape and two circular sheets inserted between said piezoelectric elements and flat surfaces of said first and second cylindrical members, said piezoelectric elements and electrode plate are connected to an ultrasonic oscillator, and the diameters of said piezoelectric elements, electrode plate and two circular sheets are smaller than that of said flat surface of said first cylindrical member; and said fastening means comprises four bolts respectively inserted into four holes of said petal type flange of said second cylindrical member, four holes of an annular spacer and said four threaded holes of said annular rigid part of said first cylindrical member;

and further including supporting means comprising an annular member having a stepped portion to be engaged with the outer periphery of said annular rigid part and having four holes, an annular supporting member having four threaded axial holes, and four bolts respectively inserted into said four axial holes of said annular member and into said four threaded axial holes of said annular supporting member, thereby supporting the ultrasonic transducer by sandwiching said annular rigid part between said annular member and annular supporting member whereby cracking of piezoelectric elements is prevented to ensure stabilized operations without transitional variations in electric impedance and resonance frequency and to allow continuous vibrating operations of large amplitude over a long period of time.

25. An ultrasonic transducer according to claim 24, wherein said first and second cylindrical member are made of steel and are designed as follows:

the diameter and length of said tip cylindrical member of said first cylindrical member are 7.3$\phi$ and 15 mm;

the length from the tip portion to said base portion of said first cylindrical member i.e., the length of said mechanical vibration-amplifying part is 33.7 mm;

the diameter and length of said second hollow cylindrical member of said second cylindrical member are 20 o and 12 mm; and the length from said base portion to the tip portion of said second hollow cylindrical member of said second cylindrical member is 34.3 mm;

so that said base portion is positioned at a nodal line of the one-quarter wavelength in the half wavelength longitudinal resonance vibration of 38.0 KHz and the total length of said ultrasonic transducer is a half wavelength.

26. An ultrasonic transducer according to claim 24, wherein:

said tip cylindrical member further comprises a hollow cylindrical vibratory part at the front end portion, said hollow cylindrical vibratory part of predetermined inner and outer diameters and length being provided perpendicularly to the axis of said tip cylindrical member.

27. An ultrasonic transducer according to claim 24, wherein:

said tip cylindrical member further comprises a disc shaped part at the front end portion, said disc shaped part of predetermined diameter and thickness being coaxially provided to the axis of said tip cylindrical member.

28. An ultrasonic transducer according to claim 3, wherein said first cylindrical member comprises:

one member comprising said mechanical vibration amplifying members being formed in a stepped type horn having one-quarter wavelength in the longitudinal resonance vibration mode, said base portion comprising a cylindrical member, of large volume and a half wavelength in the longitudinal resonance vibration mode, integrally formed to said mechanical vibration amplifying member, and said flange of annular shape integrally formed at an outer wall of said base portion; and said annular rigid member contacting said flange at said annular flat surface.

29. An ultrasonic transducer according to claim 3, wherein said first cylindrical member comprises:

a first member forming said mechanical vibration amplifying member being formed in a stepped type horn which has one-quarter wavelength in the longitudinal resonance vibration mode and a flange part;

a second member forming said base portion being formed in a solid cylindrical member, of a half wavelength in the longitudinal resonance vibration mode, which is fixed to said first member by the adhesive and has a flange at the base portion; and said annular rigid member contacting said flange of said second member at said annular flat surface.

30. An ultrasonic transducer according to claim 3, wherein said first cylindrical member comprises:

one member comprising said mechanical vibration amplifying member of a long stepped type horn having three-quarter wavelength in the longitudinal resonance vibration mode, said base portion comprising a disc part of short volume integrally formed to said mechanical vibration amplifying member, and said flange is formed at the outer peripheral part of said disc part; and said annular rigid member contacting said flange at said annular flat surface.

31. An ultrasonic transducer according to claim 3, wherein said first cylindrical member comprises:

a first member forming a part of said mechanical vibration amplifying member of an exponential type horn;

a second member forming another part of said mechanical vibration amplifying member of a stepped type horn, which has said base portion of a disc shape member and said flange formed at the outer peripheral part of said base portion; and said annular rigid member contacting said flange at said annular flat surface.

32. An ultrasonic transducer according to claim 3, wherein:

said flat surface of said mechanical vibration amplifying member is integrally formed with a circular projection axially projected therefrom and having a circular flat surface, and said piezoelectric elements are compressedly held between said circular flat surface of said circular projection and said flat surface of said second cylindrical member, thereby strengthening said flat surface of said first cylindrical member, and further reducing the flexural vibration of said flat surface.

33. An ultrasonic transducer according to claim 3 wherein:

said mechanical vibration amplifying member is selected from the group consisting of an exponential horn, a stepped horn, a conical horn, a Fourier horn and a catenary horn.

34. An ultrasonic transducer according to claim 3 wherein:

said base portion of said first cylindrical member has a disc-like shape of small volume.

35. An ultrasonic transducer according to claim 3 wherein:

said base portion of said first cylindrical member has a cylinder shape of large volume.

36. An ultrasonic transducer according to claim 3 wherein:

said base portion of said mechanical vibration amplifying member is positioned at a nodal plane of a predetermined resonance vibration mode; and said mechanical vibration amplifying member, said annular rigid member, said second cylindrical member, said ultrasonic transducer portion and said fastening means are so dimensioned and constructed that the total length of said transducer coincides with a predetermined wavelength in resonance vibration of a predetermined mode.

37. An ultrasonic transducer according to claim 34, wherein said base portion is positioned at a nodal line of one-quarter wavelength in a half-wavelength longitudinal resonance vibration mode and the total length of said transducer is a half wavelength.

38. An ultrasonic transducer according to claim 35, wherein said base portion is positioned at a nodal line of three-quarter wavelength in one wavelength longitudinal resonance vibration mode, and the total length of said transducer is one wavelength.

39. An ultrasonic transducer according to claim 3 wherein:

said flange of said second cylindrical member is a petal type flange having notches except for those portions which are clamped by said fastening means.

40. An ultrasonic transducer according to claim 3 wherein:

said backing block is provided with a threaded portion for engaging replaceably with an attachment having a corresponding threaded portion.

41. An ultrasonic transducer according to claim 3 wherein:

said mechanical vibration amplifying member is provided with a threaded portion for engaging replaceably with an attachment having a corresponding threaded portion.

42. An ultrasonic transducer according to claim 3 wherein:

said backing block includes a main block body and a resonance adjusting block which are fastened integrally to each other by a coupling bolt.

43. An ultrasonic transducer according to claim 3 wherein:

said mechanical vibration amplifying member includes a front end portion and a rear end portion having tapped bores along the entire length which are fastened integrally to each other by a bolt passing therethrough.

* * * * *